US008079010B2

(12) United States Patent
Isomura

(10) Patent No.: US 8,079,010 B2
(45) Date of Patent: Dec. 13, 2011

(54) WIRING INFORMATION GENERATING APPARATUS, METHOD AND PROGRAM

(75) Inventor: Tomoyuki Isomura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 311 days.

(21) Appl. No.: 12/559,837

(22) Filed: Sep. 15, 2009

(65) Prior Publication Data

US 2010/0077373 A1 Mar. 25, 2010

(30) Foreign Application Priority Data

Sep. 24, 2008 (JP) ................................ 2008-244438

(51) Int. Cl.
*G06F 17/50* (2006.01)
(52) U.S. Cl. .................. 716/126; 716/119; 716/125
(58) Field of Classification Search .................. 716/119, 716/125, 126
See application file for complete search history.

(56) References Cited

U.S. PATENT DOCUMENTS

| | | | |
|---|---|---|---|
| 6,510,539 B1 * | 1/2003 | Deemie et al. ................ | 716/111 |
| 7,281,232 B1 * | 10/2007 | Nicolino et al. ............. | 716/112 |
| 2003/0125920 A1 * | 7/2003 | Matsuoka et al. ............. | 703/15 |
| 2007/0136713 A1 * | 6/2007 | Hetzel et al. .................... | 716/12 |
| 2007/0136714 A1 * | 6/2007 | Cohn et al. ...................... | 716/13 |
| 2008/0072203 A1 * | 3/2008 | Bergman Reuter et al. .... | 716/14 |
| 2008/0301616 A1 * | 12/2008 | Krauch et al. .................. | 716/12 |
| 2009/0300575 A1 * | 12/2009 | Kornachuk et al. ............ | 716/19 |
| 2010/0031220 A1 * | 2/2010 | Buehler et al. ................. | 716/14 |
| 2011/0214009 A1 * | 9/2011 | Aggarwal et al. ............ | 714/4.11 |

* cited by examiner

*Primary Examiner* — Stacy Whitmore
*Assistant Examiner* — Magid Dimyan
(74) *Attorney, Agent, or Firm* — Staas & Halsey LLP

(57) ABSTRACT

A wiring information generating apparatus includes an input unit that inputs a wiring layer number indicating a wiring layer, a via layer number indicating a next via layer to connect the wiring layer, and spacing information based on wiring rules. A storage unit stores a terminal figure table providing terminal figures, a logic element device wire protected area table, and a wire protected area table. A wire protected area creation unit adds an area of a terminal figure and a logic element device wire protected area obtained by searching the terminal figure table and the logic element device wire protected area table based on the input wiring layer number and/or via layer number and acquires wire layer-via layer spacing information. A wiring information generating unit generates wiring information in the wiring layer based on connection information and arrangement information of the semiconductor logic circuit, and wire protected area information.

14 Claims, 20 Drawing Sheets

FIG. 11A

| WIRING LAYER - VIA LAYER SPACING RULE TABLE |
|---|
| WIRING LAYER NUMBER |
| VIA LAYER NUMBER |
| SPACING VALUE |
| NEXT DATA POINTER |

FIG. 11B

| VIRTUAL FIGURE TABLE |
|---|
| LAYER NUMBER |
| LOWER LEFT VERTEX COORDINATES |
| UPPER RIGHT VERTEX COORDINATES |
| SPACING VALUE |
| NEXT DATA POINTER |

FIG. 11C

| TERMINAL FIGURE TABLE |
|---|
| LAYER NUMBER |
| LOWER LEFT VERTEX COORDINATES |
| UPPER RIGHT VERTEX COORDINATES |
| WIRING LAYER - VIA LAYER SPACING FLAG |
| NEXT DATA POINTER |

FIG. 11D

| OBSTACLE FIGURE TABLE |
|---|
| LAYER NUMBER |
| LOWER LEFT VERTEX COORDINATES |
| UPPER RIGHT VERTEX COORDINATES |
| WIRING LAYER - VIA LAYER SPACING FLAG |
| NEXT DATA POINTER |

FIG. 12
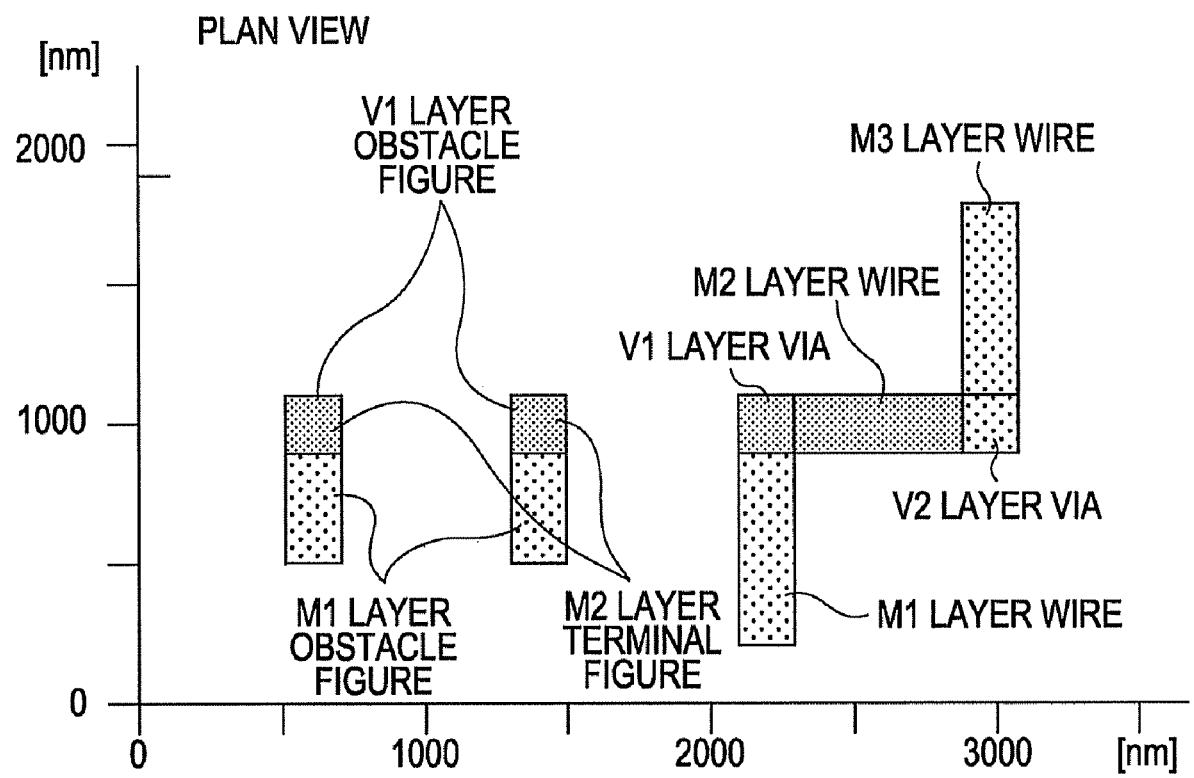
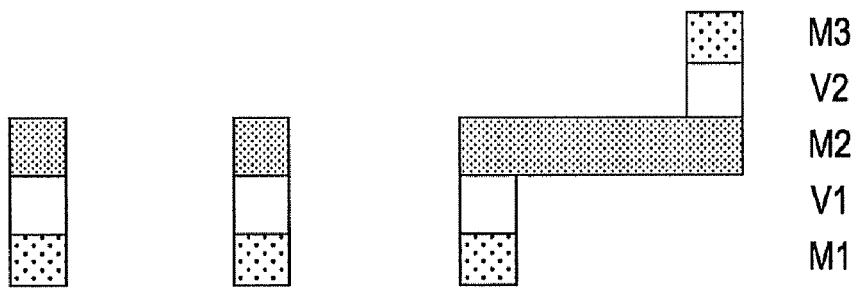

FIG. 19A

| NET TABLE |
|---|
| NET NAME |
| NET TYPE |
| WIRE TABLE POINTER |
| VIA TABLE POINTER |
| TERMINAL TABLE POINTER |
| NEXT DATA POINTER |

FIG. 19B

| LOGIC ELEMENT TABLE |
|---|
| LOGIC ELEMENT NAME |
| TERMINAL TABLE POINTER |
| OBSTACLE FIGURE TABLE POINTER |
| NEXT DATA POINTER |

FIG. 19C

| WIRE TABLE |
|---|
| LAYER NUMBER |
| START POINT COORDINATES |
| END POINT COORDINATES |
| WIRE WIDTH |
| NEXT DATA POINTER |

FIG. 19D

| VIA TABLE |
|---|
| LAYER NUMBER |
| ORIGIN COORDINATES |
| VIA NUMBER |
| NEXT DATA POINTER |

FIG. 19E

| WIRE PROTECTED AREA TABLE |
|---|
| LAYER NUMBER |
| LOWER LEFT VERTEX COORDINATES |
| UPPER RIGHT VERTEX COORDINATES |
| NEXT DATA POINTER |

FIG. 19F

| TERMINAL TABLE |
|---|
| TERMINAL NAME |
| TERMINAL FIGURE TABLE POINTER |
| NEXT DATA POINTER |
| NET TABLE POINTER |
| NEXT DATA POINTER OF SAME NET |

FIG. 19G

| TERMINAL FIGURE TABLE |
|---|
| LAYER NUMBER |
| LOWER LEFT VERTEX COORDINATES |
| UPPER RIGHT VERTEX COORDINATES |
| NEXT DATA POINTER |

FIG. 19H

| LAYER TABLE |
|---|
| LAYER NAME |
| LAYER NUMBER |
| LAYER TYPE |
| SPACING VALUE |
| SPACING TABLE POINTER |
| NEXT DATA POINTER |

FIG. 19I

| SPACING TABLE |
|---|
| MINIMUM VALUE |
| MAXIMUM VALUE |
| SPACING VALUE |
| NEXT DATA POINTER |

FIG. 19J

| OBSTACLE FIGURE TABLE |
|---|
| LAYER NUMBER |
| LOWER LEFT VERTEX COORDINATES |
| UPPER RIGHT VERTEX COORDINATES |
| NEXT DATA POINTER |

FIG. 19K

| VIA TYPE TABLE |
|---|
| VIA TYPE NAME |
| VIA NUMBER |
| VIA FIGURE TABLE POINTER |
| NEXT DATA POINTER |

FIG. 19L

| VIA FIGURE TABLE |
|---|
| LAYER NUMBER |
| LOWER LEFT VERTEX COORDINATES |
| UPPER RIGHT VERTEX COORDINATES |
| NEXT DATA POINTER |

WIRING INFORMATION GENERATING APPARATUS, METHOD AND PROGRAM

CROSS-REFERENCE TO RELATED APPLICATIONS

This application is based upon and claims priority to prior Japanese Patent Application No. 2008-244438 filed on Sep. 24, 2008 in the Japan Patent Office, the entire contents of which are incorporated herein by reference.

FIELD

The embodiment of the present invention relates to wiring information generating apparatus, a wiring information generating method and a wiring information generating program.

BACKGROUND

In recent years, with increasingly finer structures in LSI (Large Scale Integrated circuit) design, design rules applied to semiconductor processes become more complex to prevent deterioration of yields due to finer structures. For example, there has been no design rule concerning the minimum spacing value that defines the minimum interval value to prevent a short circuit between a wiring layer and via layers thereon and thereunder during manufacture of semiconductors. However, with increasingly finer semiconductor structures, a minimum spacing rule between the wiring layer and via layers is sometimes newly added. Here, the via layer is a layer to form a connecting hole called a "via" for the purpose of connecting wiring layers formed vertically.

In recent LSI for CPU, a technology called a body bias technology is applied for the purpose of saving power and improving yields. The body bias technology is a technology to suppress a leakage current during standby, which poses a problem with development of finer structures of process technology, by applying a voltage to a semiconductor substrate in a direction opposite to a normal direction voltage. Since a body bias power supply sometimes has a higher voltage than an ordinary power supply, design rules for high-voltage devices are applied to body bias power supply wires. In contrast to design rules for ordinary voltage devices, design rules for high-voltage devices applied to semiconductor process technology used by the applicants for manufacture of semiconductors need application of spacing rules between a wiring layer and a via layer.

Conventional wiring tools consider only spacing rules between wiring layers or between via layers and do not consider spacing rules between a wiring layer and a via layer. In the past, high-voltage devices were present only in an internal area of an IO (Input Output) macro in charge of the input/output function of LSI. Thus, it is possible to define the perimeter of a high-voltage device as a wire protected area and thus, design rules concerning spacing are not applied in the first place even if wiring tools do not consider spacing rules between a wiring layer and a via layer so that spacing rules are not violated.

However, a body bias power supply wire may be present on the whole chip surface and if the perimeter of a high-voltage device is defined as a wire protected area, an area available for wire is significantly reduced, leading to an increased chip area. An increase in chip area leads to an increase in costs and deterioration of yields. By enabling consideration of spacing rules between a wiring layer and a via layer by using wiring tools, an increase in area, that is, an increase in costs and deterioration of yields of a chip to which body bias is applied can be prevented.

Conventional wiring tools consider only minimum spacing rules between wiring layers or between via layers. The operation flow of conventional wiring information generation processing is generally like processing illustrated in FIG. 13. Incidentally, a sequence control processing below is performed while a group of table data illustrated in FIGS. 19A-19L are being stored in a storage device.

A net table (see FIG. 19A) is searched by repeated processing of operations between S1301 and the judgment at S1307 for processing all nets representing connection information of wires in a circuit. At S1302, the net type (see FIG. 19A) is verified and processing of S1303 to S1306 is performed if the net being processed has a net type to be wired. At S1303, as creation processing of a wire protected area, a wire protected area that takes spacing rules in the same layer into consideration is created for a terminal figure, obstacle figure, wire, or via figure. At S1304, a pathway that connects terminal figures belonging to the net being processed is searched for by a route searching algorithm in such a way that the wire protected areas set at S1303 are avoided. At S1305, wires and vias are registered according to route searching results in a wire table (see FIG. 19C and a via table (see FIG. 19D) respectively. At S1306, after wires are set to the pathway, all wire protected areas registered in a wire protected area table (see FIG. 19E) are deleted. At S1307, control returns to S1301 if there is any unprocessed net.

In control operations illustrated by an operation flowchart in FIG. 13, details of creation processing of a wire protected area at S1303 is illustrated by an operation flowchart in FIG. 14. A logic element device table (see FIG. 19B) is searched by repeated processing of S1402 and S1403 operations between S1401 and the judgment at S1404 for processing all logic element devices.

At S1402, wire protected areas are created for terminal figures held by a logic element device. A terminal is a circuit component that connects wires. At S1403, wire protected areas are created for obstacle figures held by a logic element device. An obstacle figure is a figure portion that is constructed inside a logic element device and in which it is preferable to prohibit wiring and is a wire protected area inside a logic element device. At S1404, control returns to S1401 if there is any unprocessed logic element device.

Subsequently, the net table (see FIG. 19A) is searched by repeated processing of operations of S1406 to S1408 between S1405 and the judgment at S1409 for processing all nets. At S1406, only nets excluding those being wired are selected. At S1407, wire protected areas for existing wires for a net are created. At S1408, wire protected areas for existing via figures for a net are created. At S1409, control returns to S1405 if there is any unprocessed net.

In control operations illustrated by the operation flowchart in FIG. 14, a control operation of creating wire protected areas for terminal figures held by the logic element device at S1402 is illustrated by an operation flowchart in FIG. 15. A terminal table (see FIG. 19F) is searched by repeated processing of operations S1502 to S1508 between S1501 and the judgment at S1509 for processing all terminals. At S1502, only nets that are not being wired are selected. A terminal figure table (see FIG. 19G) held by a terminal is searched by repeated processing of S1503 to 1507 operations between S1502 and the judgment at S1508 for processing all terminal figures held by one terminal. At S1504, a layer table (see FIG. 19H) is searched to acquire a layer having the layer number of the terminal figure being processed. At S1505, an X-axis direction size and a Y-axis direction size are calculated from lower left vertex coordinates and upper right vertex coordinates (see FIG. 19G) of the terminal figure being processed to decide a smaller value as the width.

At S1506, a registered entry in which the minimum width and maximum width satisfying the following condition, is searched for from a spacing table (see FIG. 19I) pointed to by a spacing pointer (see FIG. 19H) held by the layer acquired at S1504. Then, the spacing value registered in the searched entry is acquired.

Condition: Minimum width≦width decided at
S1505≦maximum width

The spacing value represents a horizontal distance between one wire among a plurality of wires and another wire when the semiconductor substrate is assumed to be in a horizontal plane. At S1507, a wire protected area is registered in the wire protected area table (see FIG. 19E). In the table, the layer number (see FIG. 19G) of the terminal figure being processed is set as the layer number. In the table, lower left vertex coordinates and upper right vertex coordinates of a figure obtained by extending the lower left vertex coordinates and upper right vertex coordinates (see FIG. 19G) of the terminal figure being processed by the spacing value acquired at S1506 vertically and horizontally are set as the lower left vertex coordinates and upper right vertex coordinates. Accordingly, in the wiring layer in which the terminal figure is present, a wire protected area will be set for the terminal figure and the range corresponding to the spacing value therearound.

At S1508, control returns to S1503 if there is any unprocessed terminal figure. After processing for all terminal figures held by one terminal is completed by processing S1503 to S1508, a judgment at S1509 is made and control returns to S1501 if there is any unprocessed terminal.

In control operations illustrated by the operation flowchart in FIG. 14, a control operation of creating wire protected areas for obstacle figures held by the logic element device at S1403 is illustrated by an operation flowchart in FIG. 16. An obstacle figure table (see FIG. 19I) held by the logic element device is searched by repeated processing of operations S1602 to S1606 between S1601 and the judgment at S1607 for processing all obstacle figures. At S1602, the layer table (see FIG. 19H) is searched to acquire a layer having the layer number (see FIG. 19I) of the obstacle figure being processed. At S1603, if the layer type of the layer acquired at S1602 is a wiring layer, processing at the next S1604 is performed.

At S1604, the X-axis direction size and the Y-axis direction size are calculated from lower left vertex coordinates and upper right vertex coordinates (see FIG. 19I) of the obstacle figure being processed to decide a smaller value as the width.

At S1605, if the layer type of the layer acquired at S1602 is a wiring layer, a registered entry in which the minimum width and maximum width satisfying the following condition, is searched for from the spacing table (see FIG. 19I) pointed to by the spacing pointer (see FIG. 19H) held by the layer acquired at S1602. Then, the spacing value registered in the searched entry is acquired.

Condition: Minimum width≦width decided at step
S1604≦maximum width

If the layer type of the layer acquired at S1602 is a via layer, instead of a wiring layer, the spacing value in the spacing table (see FIG. 19I) pointed to by the spacing pointer (see FIG. 19H) held by the layer acquired at S1602 is acquired.

At S1606, a wire protected area is registered in the wire protected area table (see FIG. 19E). In the table, the layer number (see FIG. 19I) of the obstacle figure being processed is set as the layer number. In the table, lower left vertex coordinates and upper right vertex coordinates of a figure obtained by extending the lower left vertex coordinates and upper right vertex coordinates (see FIG. 19J) of the obstacle figure being processed by the spacing value acquired at S1605 vertically and horizontally are set as the lower left vertex coordinates and upper right vertex coordinates. Accordingly, in the wiring layer or via layer in which the obstacle figure is present, a wire protected area will be set for the obstacle figure and the range corresponding to the spacing value therearound.

At S1607, control returns to S1601 if there is any unprocessed obstacle figure.

In control operations illustrated by the operation flowchart in FIG. 14, a control operation of creating wire protected areas for wires for the net at S1407 is illustrated by an operation flowchart, in FIG. 17. The wire table (see FIG. 19C) for the net is searched by repeated processing of operations S1702 to S1705 between S1701 and the judgment at S1706 for processing all wires.

At S1702, the layer table (see FIG. 19H) is searched to acquire a layer having the layer number (see FIG. 19C) of the wire being processed. At S1703, the wire width (see FIG. 19C) of the wire being processed is acquired. At S1704, a registered entry in which the minimum width and maximum width satisfying the following condition, is searched for from the spacing table (see FIG. 19I) pointed to by the spacing pointer (see FIG. 19H) held by the layer acquired at S1702. Then, the spacing value registered in the searched entry is acquired.

Condition: Minimum width≦wire width acquired at
step S1703≦maximum width

At S1705, a wire protected area is registered in the wire protected area table (see FIG. 19E). In the table, the layer number (see FIG. 19C) of the wire being processed is set as the layer number. In the table, as lower left vertex coordinates and upper right vertex coordinates, an inclusion rectangle of the wire is calculated from start point coordinates, end point coordinates, and the wire width (see FIG. 19C) of the wire being processed. Then, lower left vertex coordinates and upper right vertex coordinates of a figure obtained by extending the lower left vertex coordinates and upper right vertex coordinates of the calculated inclusion rectangle by the spacing value acquired at S1704 are set. Accordingly, a wire protected area will be set in the wiring layer for a rectangle area corresponding to the wire and the range corresponding to the spacing value therearound.

At S1706, control returns to S1701 if there is any unprocessed wire.

In control operations illustrated by the operation flowchart in FIG. 14, a control operation of creating wire protected areas for via figures for the net at S1408 is illustrated by an operation flowchart in FIG. 18. The via table (see FIG. 19D) for the net is searched by repeated processing of operation S1802 to S1809 between S1801 and the judgment at S1810 for processing all vias.

At S1802, a via type table (see FIG. 19K) is searched to acquire the via type having the via number (see FIG. 19D) of the via being processed. A via figure table (see FIG. 19L) is searched by a figure table pointer (see FIG. 19K) held by the via type acquired at S1802 by repeated processing of operations S1803 to S1808 between S1802 and the judgment at S1809. Then, processing of S1803 to S1808 is performed for all via figures held by the via type.

At S1804, the layer table (see FIG. 19H) is searched to acquire a layer having the layer number (see FIG. 19L) of the via figure being processed. At S1805, if the layer type of the layer acquired at S1804 is a wiring layer, processing at the next S1806 is performed. At S1806, the X-axis direction size and the Y-axis direction size are calculated from lower left vertex coordinates and upper right vertex coordinates (see FIG. 19L) of the via figure being processed to decide a smaller value as the width.

At S1807, if the layer type of the layer acquired at S1804 is a wiring layer, a registered entry in which the minimum width and maximum width satisfying the following condition, is searched for from the spacing table (see FIG. 19I) pointed to by the spacing pointer (see FIG. 19H) held by the layer acquired at S1804. Then, the spacing value registered in the searched entry is acquired.

Condition: Minimum width≦width decided at S1806≦maximum width

If the layer type of the layer acquired at S1804 is a via layer, instead of a wiring layer, the spacing value (see FIG. 19H) in the entry of the layer table corresponding to the layer acquired at S1804 is acquired.

At S1808, a wire protected area is registered in the wire protected area table (see FIG. 19E). In the table, the layer number (see FIG. 19L) of the via figure being processed is set as the layer number. In the table, lower left vertex coordinates and upper right vertex coordinates of a figure obtained by extending the lower left vertex coordinates and upper right vertex coordinates (see FIG. 19L) of the via figure being processed by the spacing value acquired at S1807 vertically and horizontally and adding values of origin coordinates (see FIG. 19D) of the via being processed are set as the lower left vertex coordinates and upper right vertex coordinates. Accordingly, in the wiring layer or via layer, a wire protected area will be set for the via figure and the range corresponding to the spacing value therearound.

At S1809, control returns to S1803 if there is any unprocessed via figure. After processing for all via figures held by one via is completed by processing by S1803 to S1809, a judgment at S1810 is made and control to return to S1801 is exercised if there is any unprocessed via.

Wire protected areas corresponding to circuit components are set as described above and wiring processing based thereon is performed to realize generation of wiring information.

SUMMARY

According to an aspect of the invention, a wiring information generating apparatus includes an input unit that inputs a wiring layer number indicating wiring layer, a via layer number indicating next via layer to connect the wiring layer, and spacing information based on wiring rules, a storage unit that stores a terminal figure table providing terminal figures, a logic element device wire protected area table, and a wire protected area table, a wire protected area creation unit that adds an area of a terminal figure and a logic element device wire protected area obtained by searching the terminal figure table and the logic element device wire protected area table based on the input wiring layer number and/or via layer number and acquires first spacing information and a wiring information generating unit that generates wiring information in the wiring layer based on connection information and arrangement information of the semiconductor logic circuit, and wire protected area information.

It is to be understood that both the foregoing general description and the following detailed description are exemplary and explanatory and are not restrictive of the invention, as claimed.

BRIEF DESCRIPTION OF DRAWINGS

FIGS. 11A-11D are table configuration diagrams for wiring information generation processing in an embodiment;

FIG. 12 is a diagram illustrating concrete examples of a terminal figure, obstacle figure, wire, and via figure in an embodiment;

FIGS. 19A-19L are table configuration diagrams for wiring information generation processing;

DETAILED DESCRIPTION OF EMBODIMENT(S)

A preferred embodiment will be described below in detail with reference to drawings.

As described above, it is increasingly becoming preferable to apply spacing rules between a wiring layer and a via layer to devices and wires for body bias power supply. Since information to distinguish a device from other devices is added to devices for body bias power supply during cell design, information indicating whether a device is for body bias power supply or not can be added when the device is converted into a terminal figure or obstacle figure. That is, information indicating whether spacing rules between a wiring layer and a via layer are applied or not can be added. Whether a net is for body bias power supply or not can be judged based on a net type of the net. In the present embodiment, these facts are used.

Incidentally, power supply wires are already wired by dedicated wiring tools before a wiring tool (so-called router) is executed.

Figure 1:
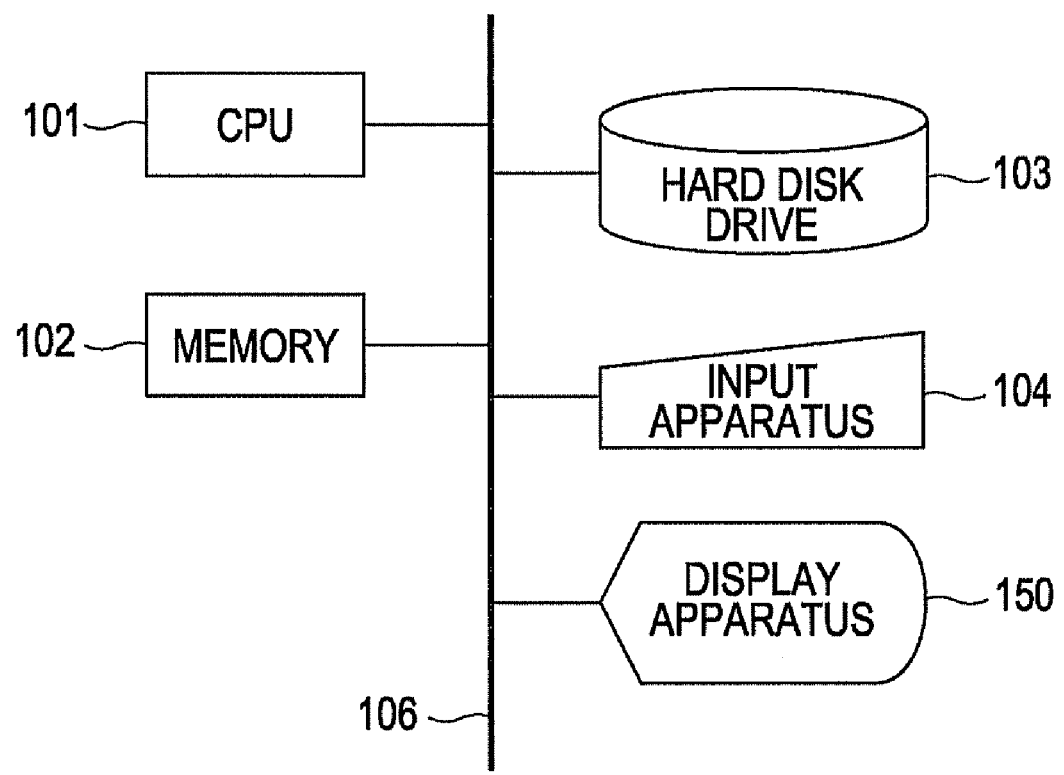
FIG. 1 is a configuration diagram of a computer system in which a software system according to an embodiment operates.

FIG. 1 is a configuration diagram of a computer system having a computer (information processing apparatus) in which a software system in the present embodiment operates. The computer system may have a general configuration in which a CPU (Central Processing Unit) 101, a memory 102, a Hard Disk Drive 103, an input apparatus 104 such as a keyboard and mouse, a display apparatus 105 such as a display and the like are connected by a bus 106 or the like.

Figure 2:
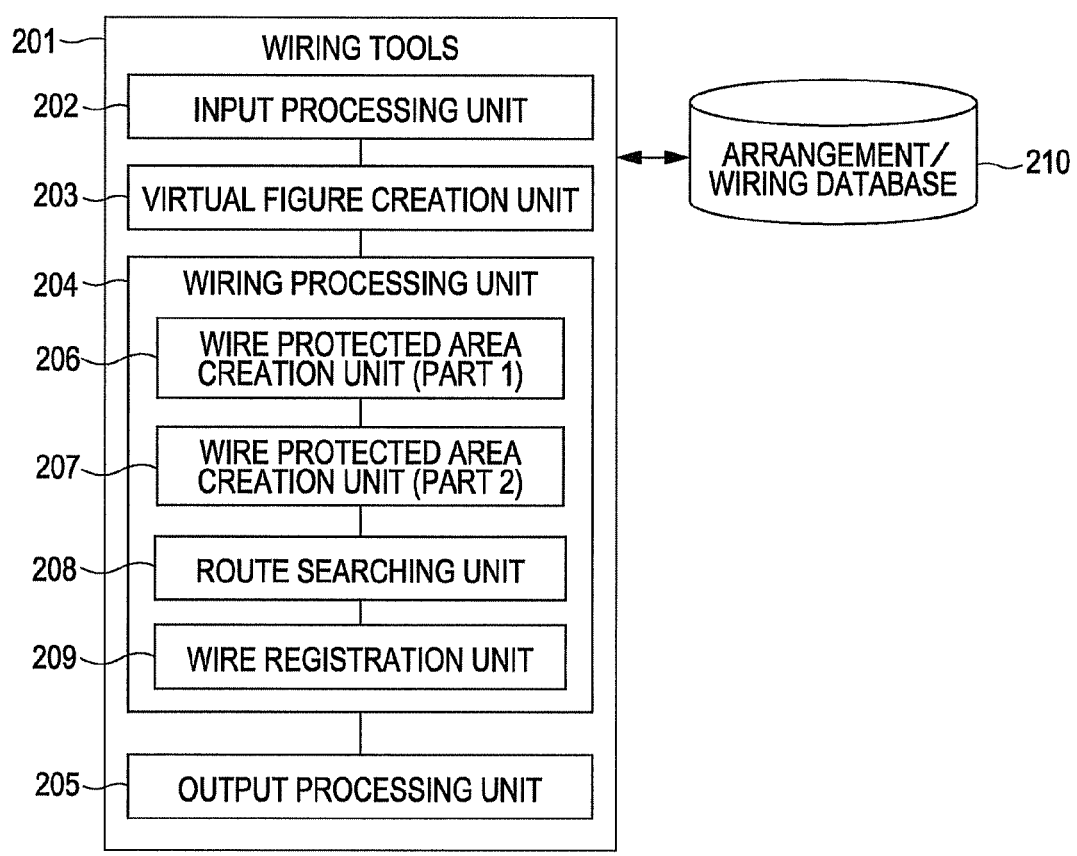
FIG. 2 is a function configuration diagram of the software system according to the embodiment.

FIG. 2 is a function configuration diagram of the software system according to the present embodiment. The system is realized as a wiring tools 201 that perform wiring processing based on arrangement/wiring data stored in an arrangement/wiring database 210. The wiring tools 201 include an input processing unit 202, a virtual figure creation unit 203, a wiring processing unit 204, and an output processing unit 205. The wiring processing unit 204 further includes a wire protected area creation unit (part 1) 206, a wire protected area creation unit (part 2) 207, a route searching unit 208, and a wire registration unit 209.

The arrangement/wiring database 210 in FIG. 2 is stored in the Hard Disk Drive 103 in FIG. 1. The wiring tools 201 in FIG. 2 are realized as processing by a wiring tools program stored in the Hard Disk Drive 103 being read into the memory 102 and executed by the CPU 101 in FIG. 1. The processing thereof is represented by operation flowcharts illustrated in FIGS. 3 to 10 and data structures in FIGS. 11A-11D and 19A-19L below.

Processing in the present embodiment is characterized in that the virtual figure creation unit 203 is added. Regarding table structures needed for processing, as illustrated in FIGS. 11A-11D, a wiring layer-via layer spacing rule table (see FIG. 11A) and a virtual figure table (see FIG. 11B) are added to tables in FIGS. 19A-19L. Moreover, a wiring layer-via layer spacing flag is added to a terminal figure table (see FIG. 11C) and an obstacle figure table (see FIG. 11D). The wiring layer-via layer spacing flag is preset to be an ON state for terminal figures and obstacle figures to which wiring layer-via layer spacing rules are applied and it is preset to be an OFF state for other terminal figures and obstacle figures.

Figure 3:
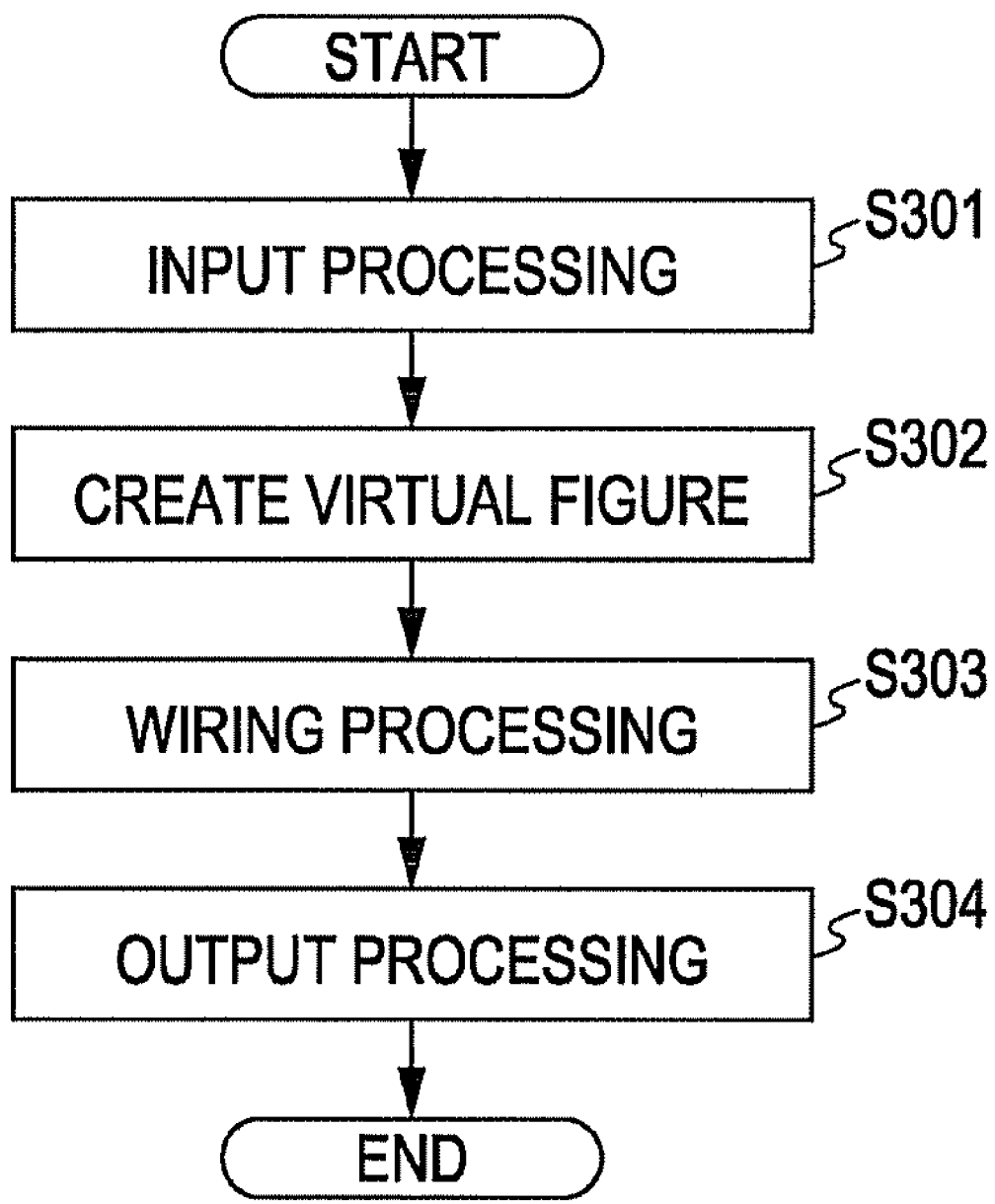
FIG. 3 is an operation flowchart illustrating overall processing of wiring tools 201 in FIG. 2.

FIG. 3 is an operation flowchart illustrating overall processing of the wiring tools 201 in FIG. 2. First, at S301, as an operation of the input processing unit 202 in FIG. 2, each table illustrated in FIGS. 11(A) to (D) and FIGS. 19(A) to (F), (H), (I), (K), and (L) used for wiring processing is created from information registered in the arrangement/wiring database 210 (see FIG. 2). At S302, as an operation of the virtual figure creation unit 203 in FIG. 2, virtual figures are created for terminal figures, obstacle figures, wires, and via figures. At S303, as an operation of the wiring processing unit 204 in FIG. 2, wiring processing is performed based on connection information of nets. At S304, as an operation of the output processing unit 205 in FIG. 2, a result of the wiring processing is reflected in the arrangement/wiring database 210.

Figure 4:
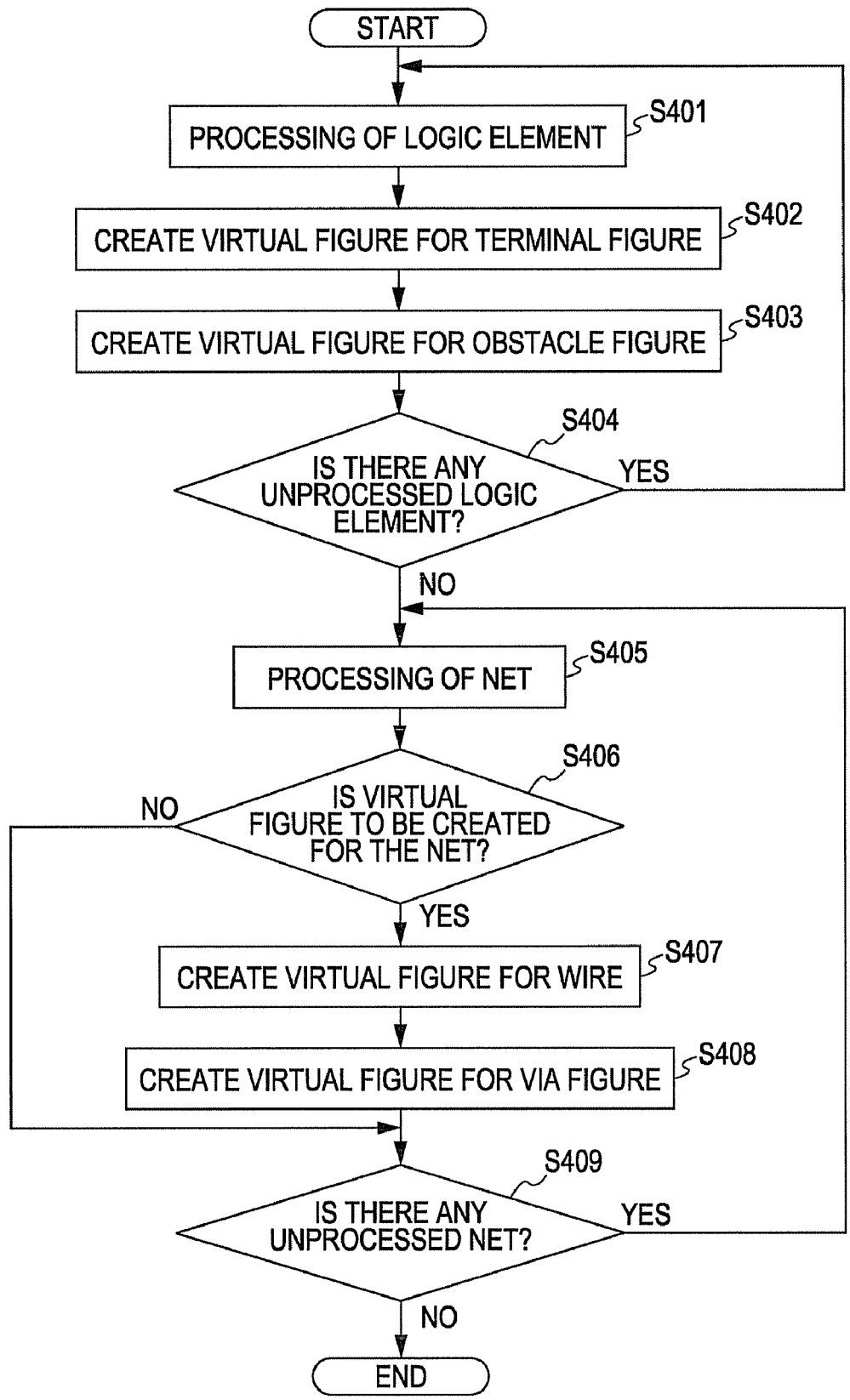
FIG. 4 is an operation flowchart illustrating virtual figure creating processing of S302 in FIG. 3.

FIG. 4 is an operation flowchart illustrating virtual figure creating processing of S302 in FIG. 3. The logic element device table (see FIG. 19B) is searched by repeated processing of operations S402 and S403 between S401 and the judgment at S404 to for processing all logic element devices.

At S402, virtual figures are created for terminal figures held by a logic element device. A terminal is a circuit component that connects wires. At S403, virtual figures are created for obstacle figures held by a logic element device. An obstacle figure is a wire protected area inside the logic element device. At S404, control returns to S401 if there is any unprocessed logic element device.

Subsequently, a net table (see FIG. 19A) is searched by repeated processing of operations of S405 to S408 between S405 and the judgment at S409 for processing all nets. At S406, nets for which virtual figures are created are selected. At S407, virtual figures are created for existing wires for a net. At S408, virtual figures are created for existing via figures for a net. At S409, control returns to S405 if there is any unprocessed net.

Figure 5:
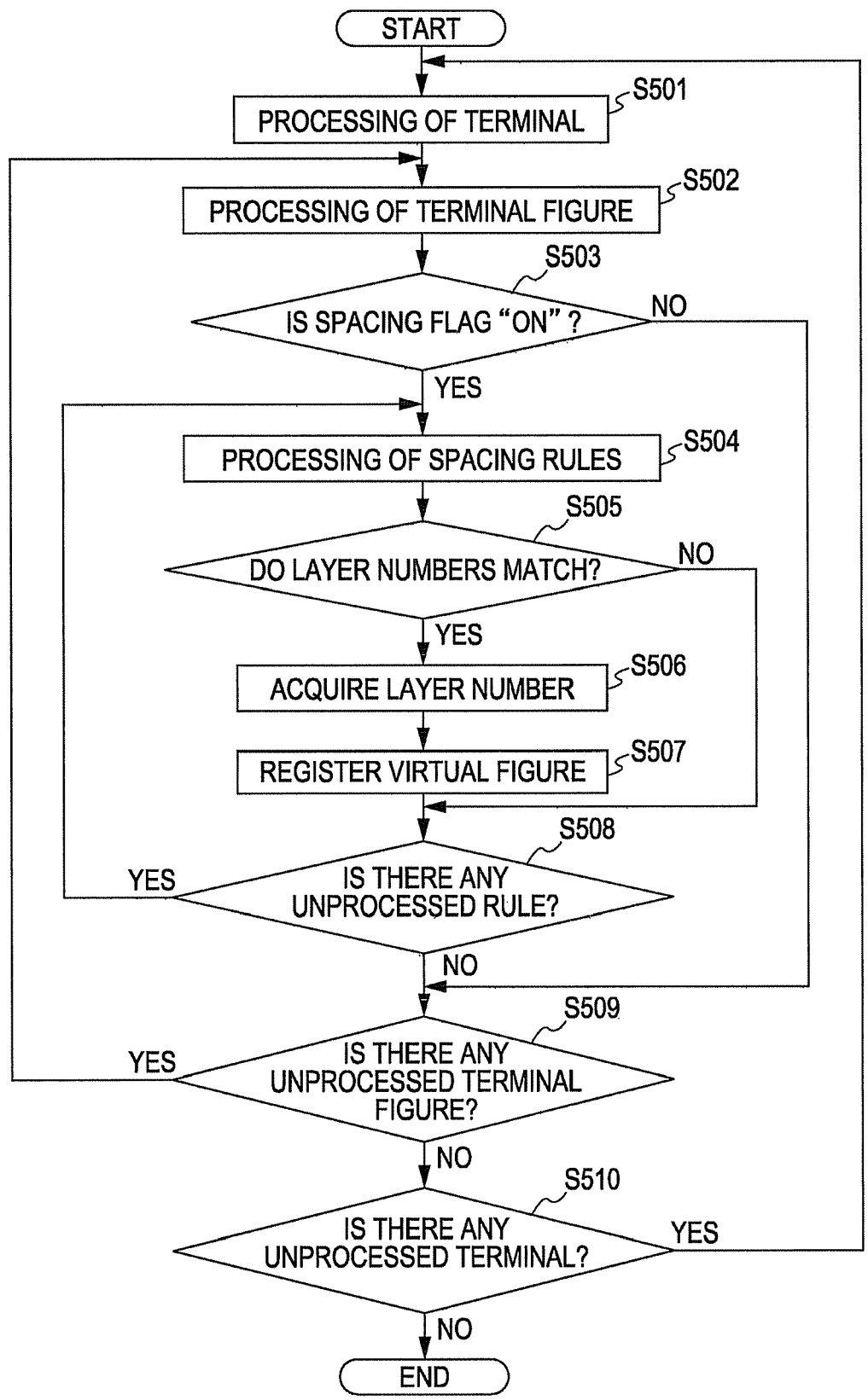
FIG. 5 is an operation flowchart illustrating the virtual figure creating processing for a terminal figure having a logic element device at S402 in FIG. 4.

In control operations illustrated by the operation flowchart in FIG. 4, a control operation of creating virtual figures for terminal figures held by the logic element device at S402 is illustrated by an operation flowchart in FIG. 5.

A terminal table (see FIG. 19F) is searched by repeated processing of operations S501 to S510 between S501 and the judgment at S510 for processing all terminals. The terminal figure table (see FIG. 11C) held by a terminal is searched by repeated processing of operation S503 to S508 between S502 and the judgment at S509 for processing all terminal figures held by one terminal.

At S503, if the wiring layer-via layer spacing flag of the terminal figure being processed is an ON state by the wiring layer-via layer spacing flag (see FIG. 11C) in the terminal figure table being verified, processing of S504 to S508 is performed.

Processing of S505 to S507 is performed for all wiring layer-via layer spacing rules while the wiring layer-via layer spacing rule table (see FIG. 11A) is being searched by repeated processing between S504 and judgment S508.

At S505, processing of S506 and S507 is performed if a wiring layer number (see FIG. 11A) of one wiring layer-via layer spacing rule searched from the wiring layer-via layer spacing rule table matches a layer number (see FIG. 11C) of the terminal figure being processed. At S506, the via layer number (see FIG. 11A) of the wiring layer-via layer spacing rule being processed is acquired as the layer number. At S507, a virtual figure is registered in the virtual figure table (see FIG. 11B). The layer number acquired at S506 is set as the layer number. In the table, the lower left vertex coordinates and upper right vertex coordinates (see FIG. 11C) of the terminal figure being processed are set as the lower left vertex coordinates and upper right vertex coordinates. In the table, the spacing value (see FIG. 11A) in the wiring layer-via layer spacing rule searched from the wiring layer-via layer spacing rule table is set as the spacing value.

At S508, control returns to S504 if there is any unprocessed wiring layer-via layer spacing rule.

After processing for all spacing rules of one terminal figure held by one terminal is completed by processing of S504 to S508, a judgment at S509 is made and control returns to S502 if there is any unprocessed terminal figure.

After processing for all terminal figures held by one terminal is completed by processing of S502 to S509, a judgment at S510 is made and control returns to S501 if there is any unprocessed terminal.

With the above control processing, if a terminal figure is present in a wiring layer to which the wiring layer-via layer spacing rule to be applied, a virtual terminal figure is arranged in a via layer to which the wiring layer-via layer spacing rule can be applied. The virtual terminal figure in that case has the same shape as the actual terminal figure and has information so that the spacing value in the wiring layer-via layer spacing rule can be set. Then, with the virtual terminal figure, a wire protected area corresponding to the actual terminal figure that takes the wiring layer-via layer spacing rule into consideration can be set in the target via layer in creation processing (part 2) of the wire protected area at S901 in FIG. 9 described below.

Incidentally, the spacing value in this case represents a horizontal distance between one via layer among a plurality of via layers and one wire when the semiconductor substrate is assumed to be in a horizontal plane.

Figure 6:
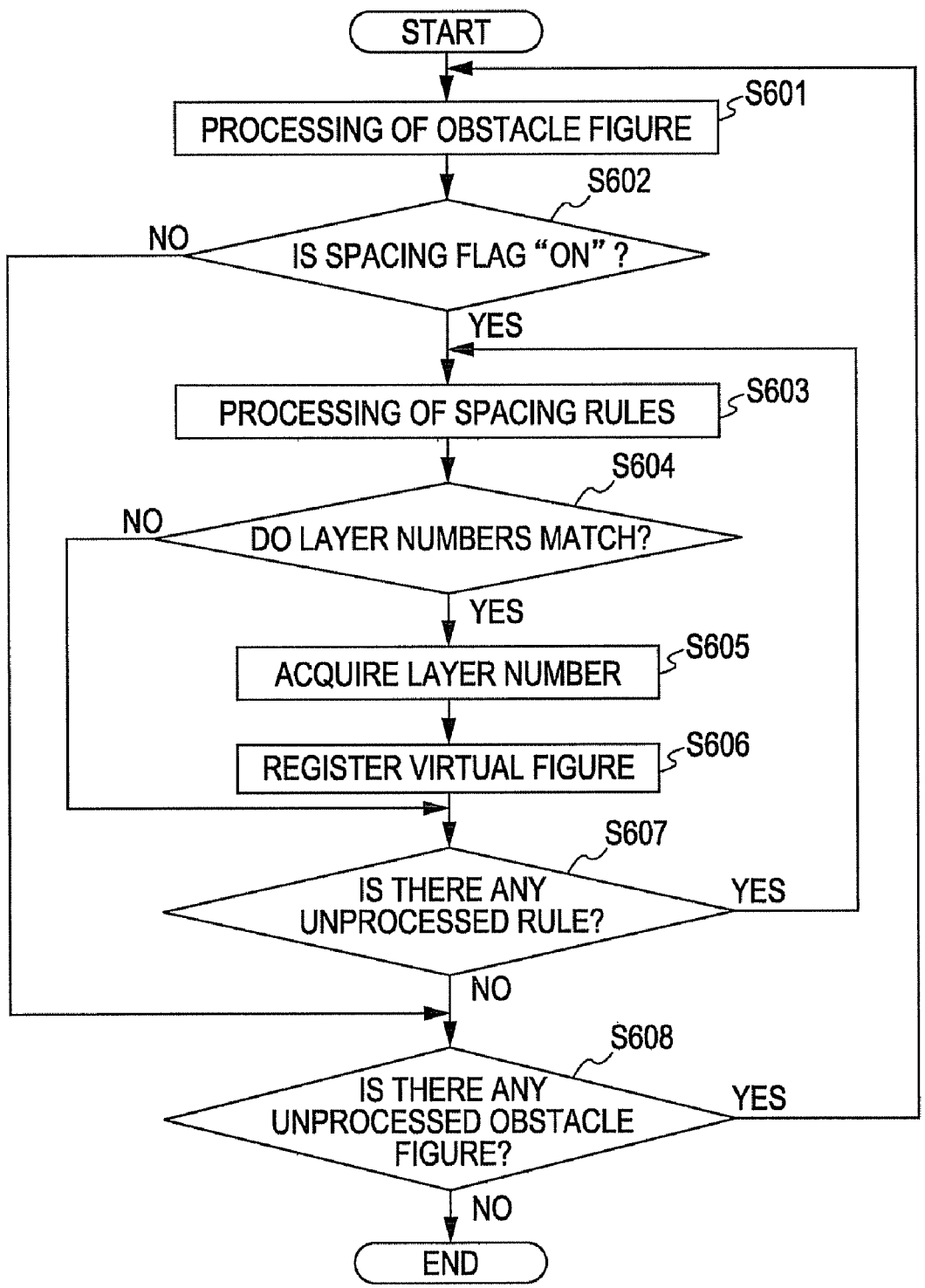
FIG. 6 is an operation flowchart illustrating the virtual figure creating processing for an obstacle figure having a logic element device at S403 in FIG. 4.

In control operations illustrated by the operation flowchart in FIG. 4, a control operation of creating virtual figures for obstacle figures held by the logic element device at S403 is illustrated by an operation flowchart in FIG. 6. The obstacle figure table (see FIG. 11D) is searched by repeated processing of operations S602 to S607 between S601 and the judgment at S608 for processing all obstacle figures.

Processing of S603 to S607 is performed if the wiring layer-via layer spacing flag of the obstacle figure being processed is an ON state by the wiring layer-via layer spacing flag (see FIG. 11D) in the obstacle figure table being verified at S602. Processing of S604 to S606 is performed for all wiring layer-via layer spacing rules while the wiring layer-via layer spacing rule table (see FIG. 11A) is being searched by repeated processing between S603 and the judgment at S607.

Processing of S605 and S606 is performed if the wiring layer number or via layer number (see FIG. 11A) of one wiring layer-via layer spacing rule searched from the wiring layer-via layer spacing rule table matches the layer number (see FIG. 11D) of the obstacle figure being processed at S604.

At S605, if the wiring layer number in the wiring layer-via layer spacing rule matches the layer number of the obstacle figure being processed at S604, the via layer number in the wiring layer-via layer spacing rule is acquired as the layer number. Conversely, if the via layer number in the wiring layer-via layer spacing rule matches the layer number of the obstacle figure being processed at S604, the wiring layer number in the wiring layer-via layer spacing rule is acquired as the layer number.

At S606, a virtual figure is registered in the virtual figure table (see FIG. 11B). The layer number acquired at S605 is set as the layer number of the virtual figure table. In the table, the lower left vertex coordinates and upper right vertex coordinates (see FIG. 11D) of the obstacle figure being processed are set as the lower left vertex coordinates and upper right vertex coordinates. In the table, the spacing value (see FIG. 11A) in the wiring layer-via layer spacing rule searched from the wiring layer-via layer spacing rule table is set as the spacing value. At S607, control returns to S603 if there is any unprocessed wiring layer-via layer spacing rule.

After processing for all spacing rules of one obstacle figure is completed by processing of S603 to S607, a judgment at S608 is made and control returns to S601 if there is any unprocessed obstacle figure.

With the above control processing, if an obstacle figure is present in a wiring layer to which the wiring layer-via layer spacing rule to be applied, a virtual obstacle figure is arranged in a via layer to which the wiring layer-via layer spacing rule to be applied. The virtual obstacle figure in that case has the same shape as the actual obstacle figure and has information so that the spacing value in the wiring layer-via layer spacing rule can be set. Conversely, if an obstacle figure is present in a via layer to which the wiring layer-via layer spacing rule to be applied, a virtual obstacle figure is also arranged. The virtual obstacle figure in that case has the same shape as the actual obstacle figure and has information that the spacing value in the wiring layer-via layer spacing rule can be set. Then, with the virtual obstacle figure being arranged in the wiring layer to which the wiring layer-via layer spacing rule is to be applied, a wire protected area corresponding to the actual obstacle figure that takes the wiring layer-via layer spacing rules into consideration can be set in the target via layer or wiring layer in creation processing (part 2) of the wire protected area at S901 in FIG. 9 described below.

Figure 7:
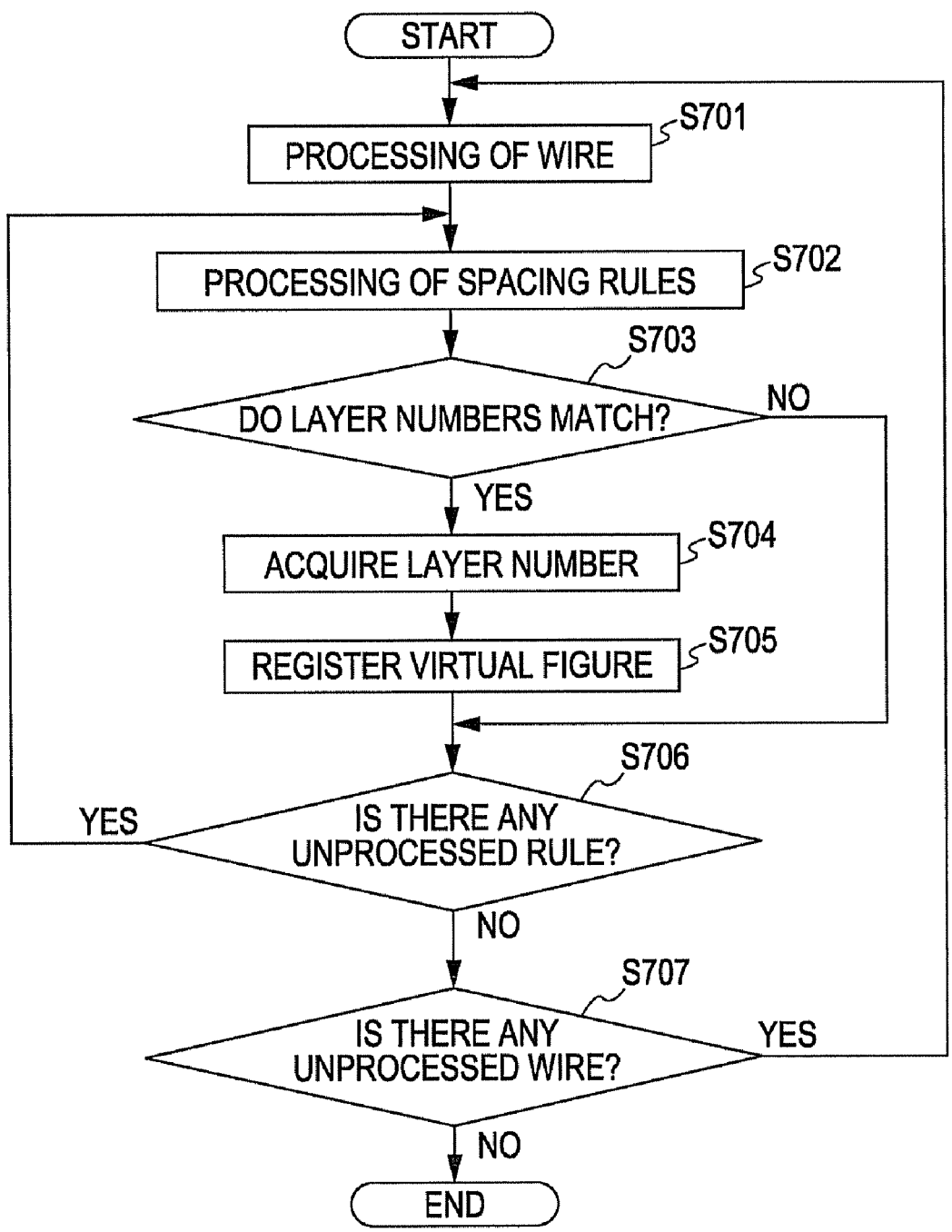
FIG. 7 is an operation flowchart illustrating the virtual figure creating processing for a wire having a net at S407 in FIG. 4.

In control operations illustrated by the operation flowchart in FIG. 4, a control operation of creating virtual figures for wires for the net at S407 is illustrated by an operation flowchart in FIG. 7. The wire table (see FIG. 19C) for a net is searched by repeated processing of operation 702 to 706 between S701 and the judgment at S707 to for processing all wires.

Processing of S703 to S705 is performed for all wiring layer-via layer spacing rules while the wiring layer-via layer spacing rule table (see FIG. 11A) is being searched by repeated processing between S702 and the judgment at S706.

Processing of S704 and S705 is performed if the wiring layer number (see FIG. 11A) of one wiring layer-via layer spacing rule searched from the wiring layer-via layer spacing rule table matches the layer number (see FIG. 19C) of the wire being processed at S703. At S704, the via layer number (see FIG. 11A) of the wiring layer-via layer spacing rule being processed is acquired as the layer number. At S705, a virtual wire figure is registered in the virtual figure table (see FIG. 11B). The layer number acquired at S704 is set to the virtual figure table as the layer number. In the table, an inclusion rectangle of a wire is calculated from start point coordinates, end point coordinates, and the wire width (see FIG. 19C) of the wire being processed and lower left vertex coordinates and upper right vertex coordinates of the rectangle are set as the lower left vertex coordinates and upper right vertex coordinates. In the table, the spacing value (see FIG. 11A) in the wiring layer-via layer spacing rule searched from the wiring layer-via layer spacing rule table is set as the spacing value.

At S706, control returns to S702 if there is any unprocessed wiring layer-via layer spacing rule. After processing for all spacing rules of one wire is completed by processing of S702 to S706, a judgment at S707 is made and control returns to S701 if there is any unprocessed wire.

With the above control processing, if a wire is present in a wiring layer to which the wiring layer-via layer spacing rule is to be applied, a virtual wire figure is arranged in a via layer to which the wiring layer-via layer spacing rule is to be applied. The virtual figure in that case has the same shape as that of the rectangle range in which the actual wire is present and has information so that the spacing value in the wiring layer-via layer spacing rule can be set. Then, with the virtual wire figure, a wire protected area corresponding to the actual wire that takes the wiring layer-via layer spacing rule into consideration can be set in the target via layer in creation processing (part 2) of the wire protected area at S901 in FIG. 9 described below.

Figure 8:
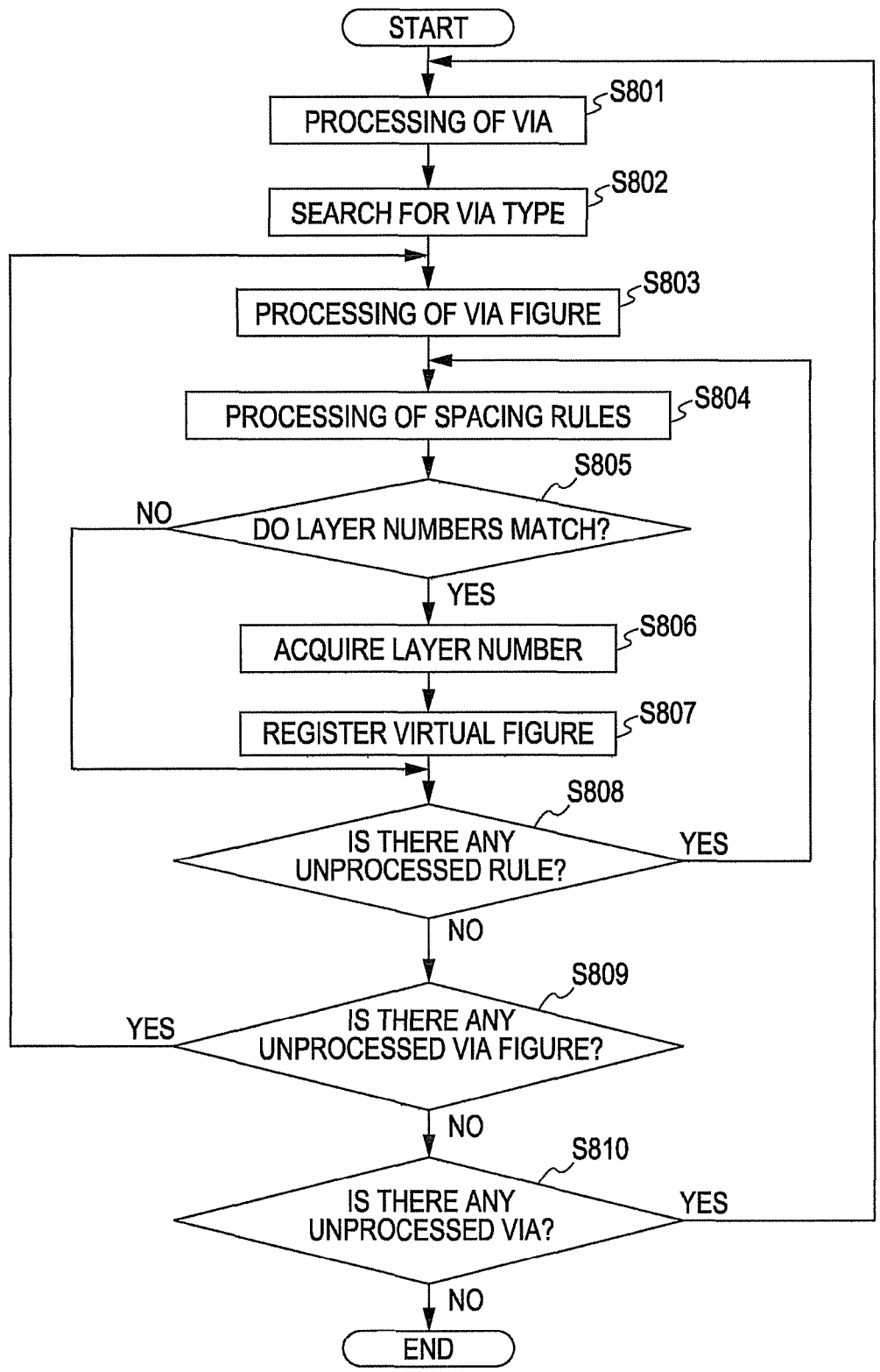
FIG. 8 is an operation flowchart illustrating the virtual figure creating processing for a via figure having a net at S408 in FIG. 4.

In control operations illustrated by the operation flowchart in FIG. 4, a control operation of creating virtual figures for via figures for the net at S408 is illustrated by an operation flowchart in FIG. 8. The via table (see FIG. 19D) for a net is searched by repeated processing of operations S802 to S809 between S801 and the judgment at S810 to for processing all vias.

At S802, the via type table (see FIG. 19K) is searched to acquire the via type having the via number (see FIG. 19D) of the via being processed. The via figure table (see FIG. 19L) is searched by a via figure table pointer (see FIG. 19K) held by the via type acquired at S802 by repeated processing between S803 and S809. Then, processing of S804 to S808 is performed for all via figures held by one via.

Processing of S805 to S807 is performed for all wiring layer-via layer spacing rules while the wiring layer-via layer spacing rule table (see FIG. 11A) is being searched by repeated processing between S804 and the judgment at S808.

Processing of S806 and S807 is performed if the wiring layer number or via layer number (see FIG. 11A) of one wiring layer-via layer spacing rule searched from the wiring layer-via layer spacing rule table matches the layer number (see FIG. 19D) of the via being processed at S805.

At S806, if the wiring layer number in the wiring layer-via layer spacing rule matches the layer number of the via being processed, the via layer number in the wiring layer-via layer spacing rule is acquired as the layer number. Conversely, if the via layer number in the wiring layer-via layer spacing rule matches the layer number of the via being processed, the wiring layer number in the wiring layer-via layer spacing rule is acquired as the layer number.

At S807, a virtual figure is registered in the virtual figure table (see FIG. 11B). The layer number acquired at S806 is set to the virtual figure table as the layer number. In the table, the lower left vertex coordinates and upper right vertex coordinates (see FIG. 19L) of the via figure being processed are set as the lower left vertex coordinates and upper right vertex coordinates. In the table, the spacing value (see FIG. 11A) in the wiring layer-via layer spacing rule searched from the wiring layer-via layer spacing rule table is set as the spacing value.

At S808, control returns to S804 if there is any unprocessed wiring layer-via layer spacing rule. After processing for all spacing rules of one via figure held by one via is completed by processing of S804 to S808, a judgment at S809 is made and control returns to S803 if there is any unprocessed via figure.

After processing for all via figures held by one via is completed by processing of S802 to S809, a judgment at S810 is made and control returns to S801 if there is any unprocessed via.

With the above control processing, if a via figure is present in a wiring layer to which the wiring layer-via layer spacing rule is to be applied, a virtual via figure is arranged. The virtual via figure in that case having the same shape as the actual via figure and information so that the spacing value in the wiring layer-via layer spacing rule can be set is arranged in a via layer to which the wiring layer-via layer spacing rule is to be applied. Conversely, if a via figure is present in a via layer to which the wiring layer-via layer spacing rule is to be applied, a virtual via figure is also arranged. The virtual via figure in that case has the same shape as the actual via figure and has information so that the spacing value in the wiring layer-via layer spacing rule can be set. Then, the virtual via figure is arranged in the wiring layer to which the wiring layer-via layer spacing rule is to be applied. Therefore, a wire protected area that takes the wiring layer-via layer spacing rules into consideration can be set in the target via layer or wiring layer in creation processing (part 2) of the wire protected area at S901 in FIG. 9 described below.

Figure 9:
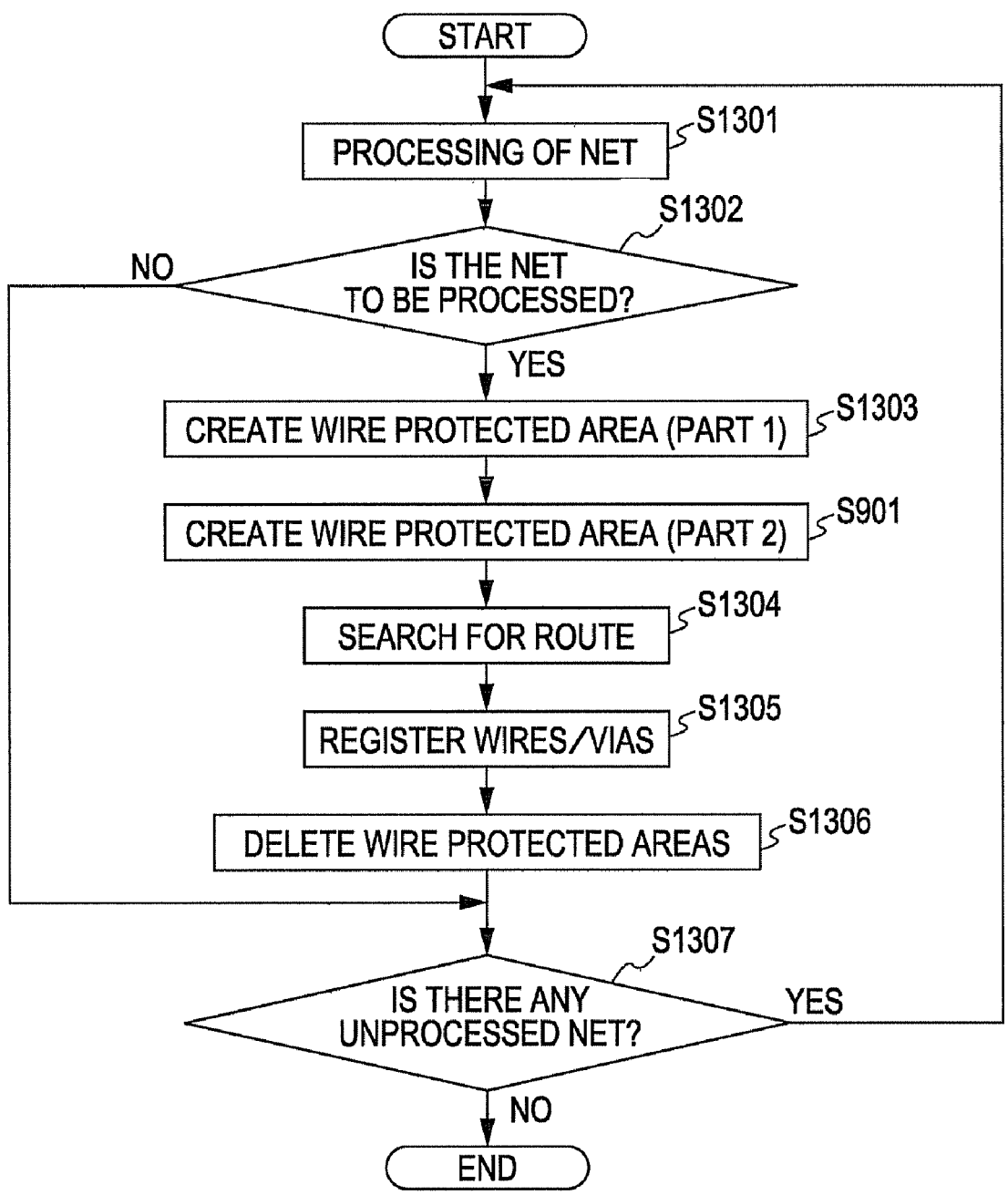
FIG. 9 is an operation flowchart illustrating wiring processing of S303 in FIG. 3.
Figure 10:
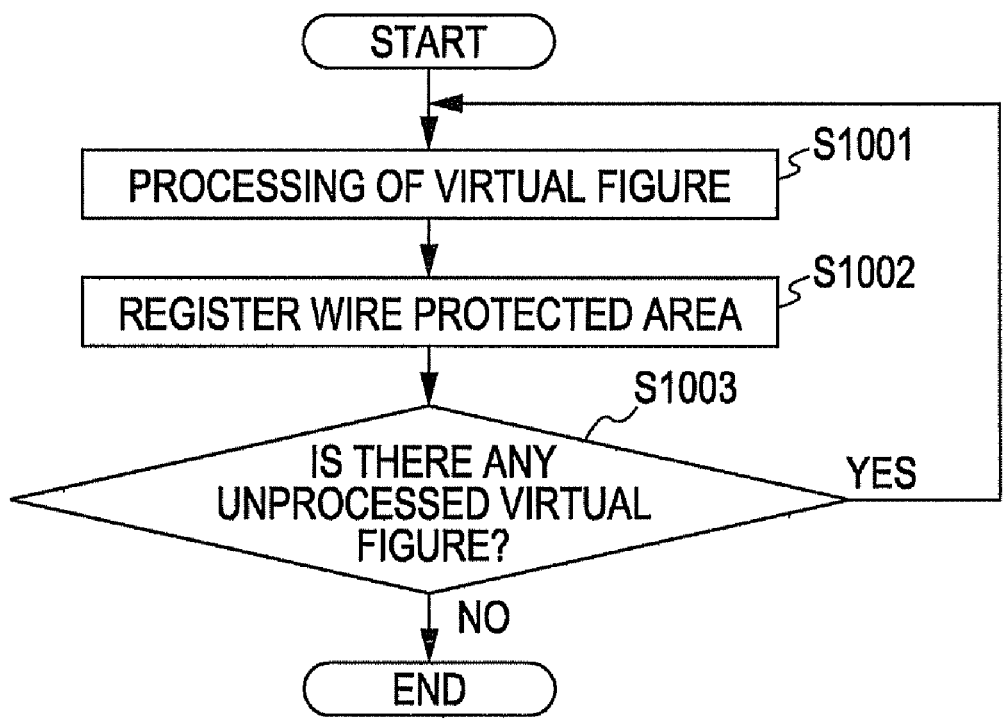
FIG. 10 is an operation flowchart illustrating wire protected area creation processing (part 2) at S901 in FIG. 9.
Figure 13:
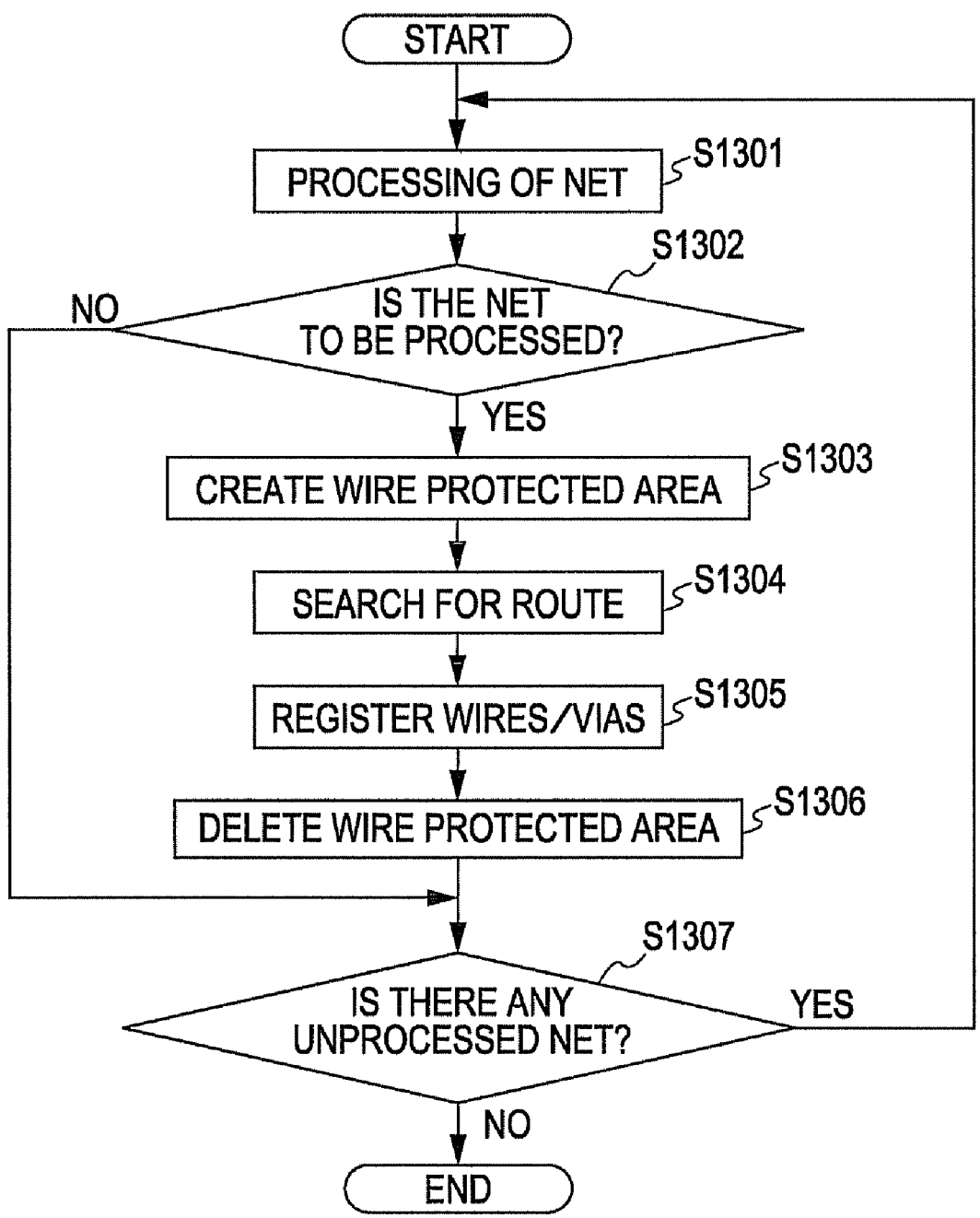
FIG. 13 is an operation flowchart illustrating conventional wiring information generation processing.
Figure 14:
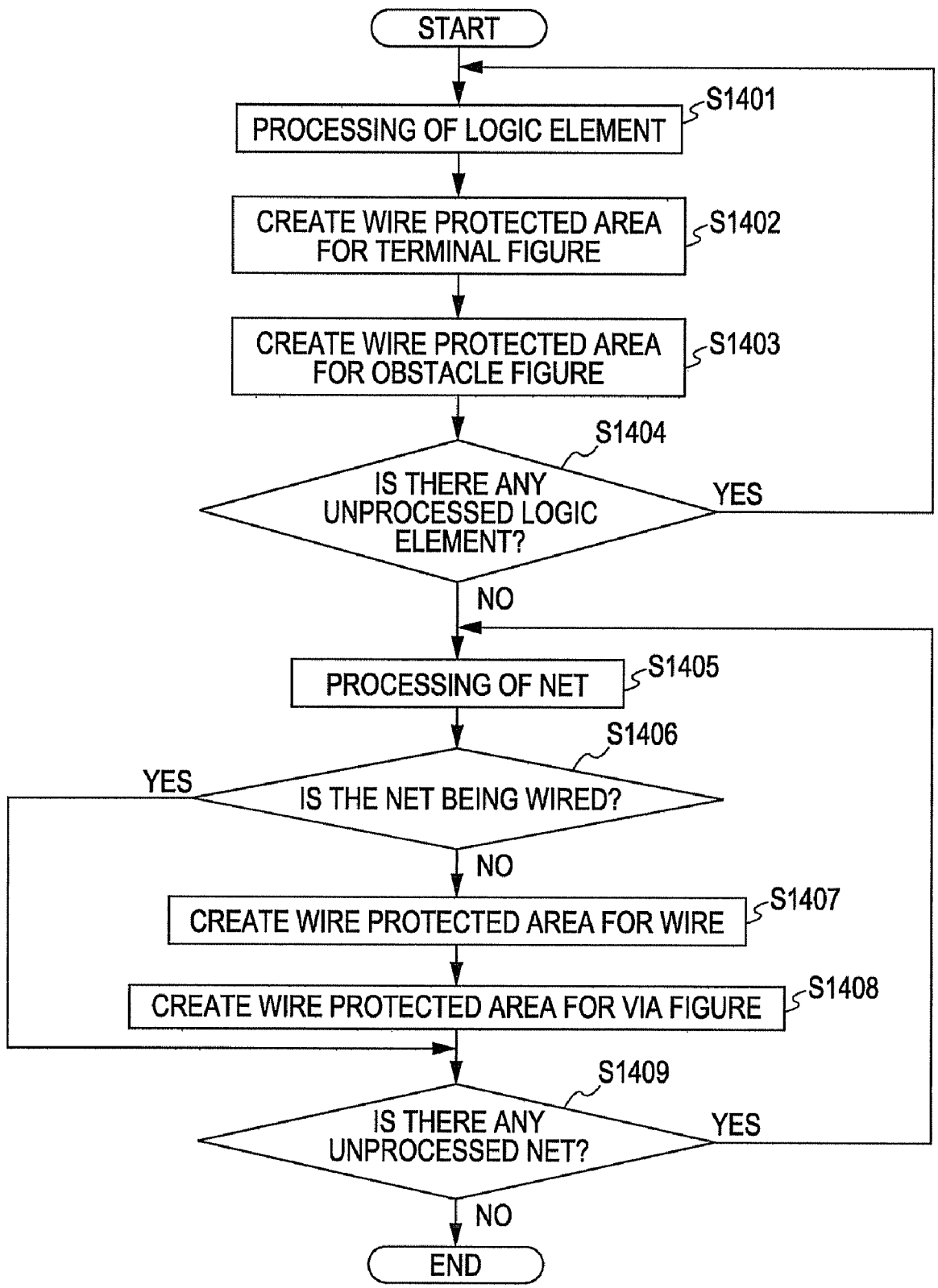
FIG. 14 is an operation flowchart illustrating the wire protected area creation processing of S1303 in FIG. 13.
Figure 15:
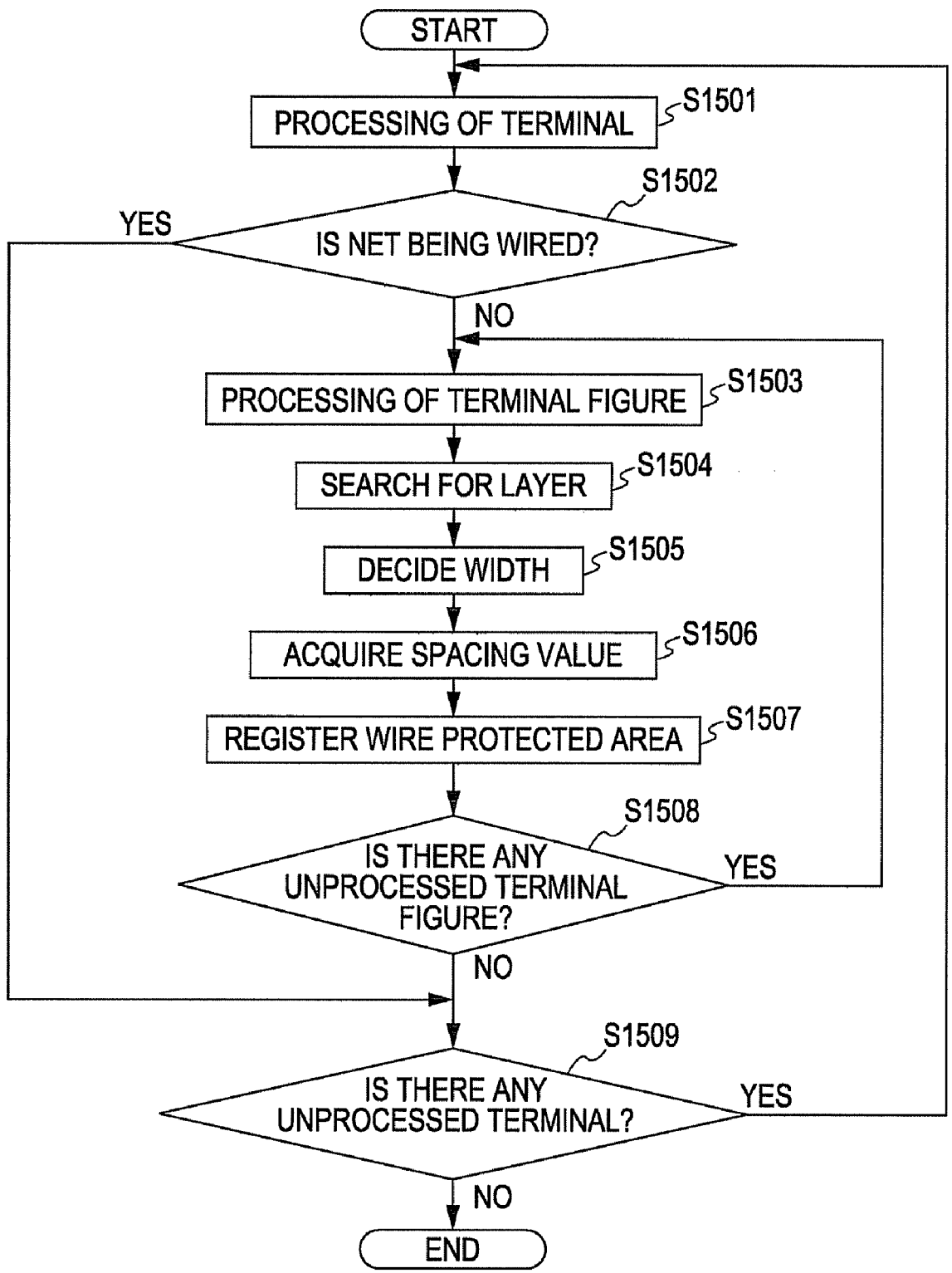
FIG. 15 is an operation flowchart illustrating creation processing of a wire protected area for the terminal figure at S1402 in FIG. 14.
Figure 16:
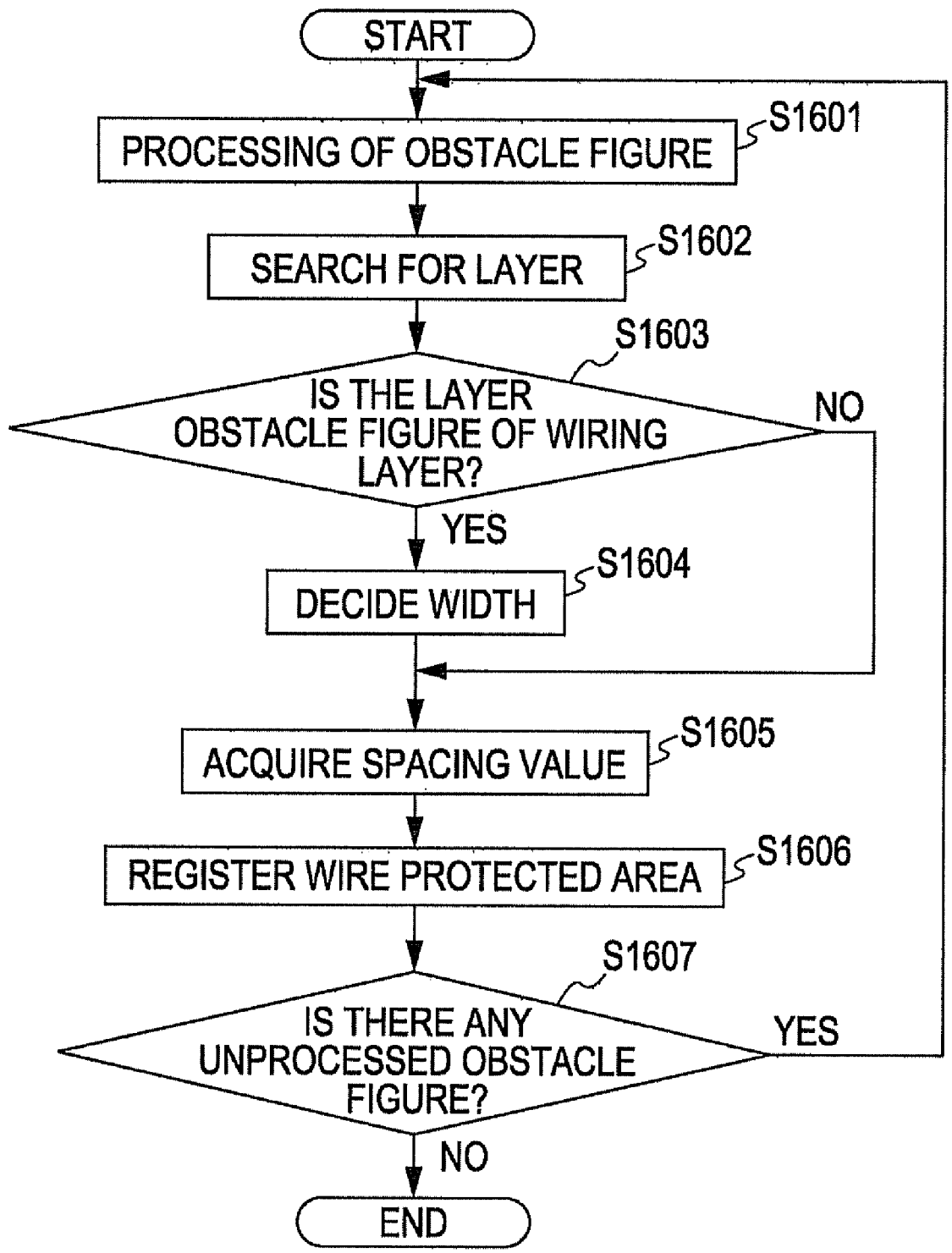
FIG. 16 is an operation flowchart illustrating the creation processing of the wire protected area for the obstacle figure at S1403 in FIG. 14.
Figure 17:
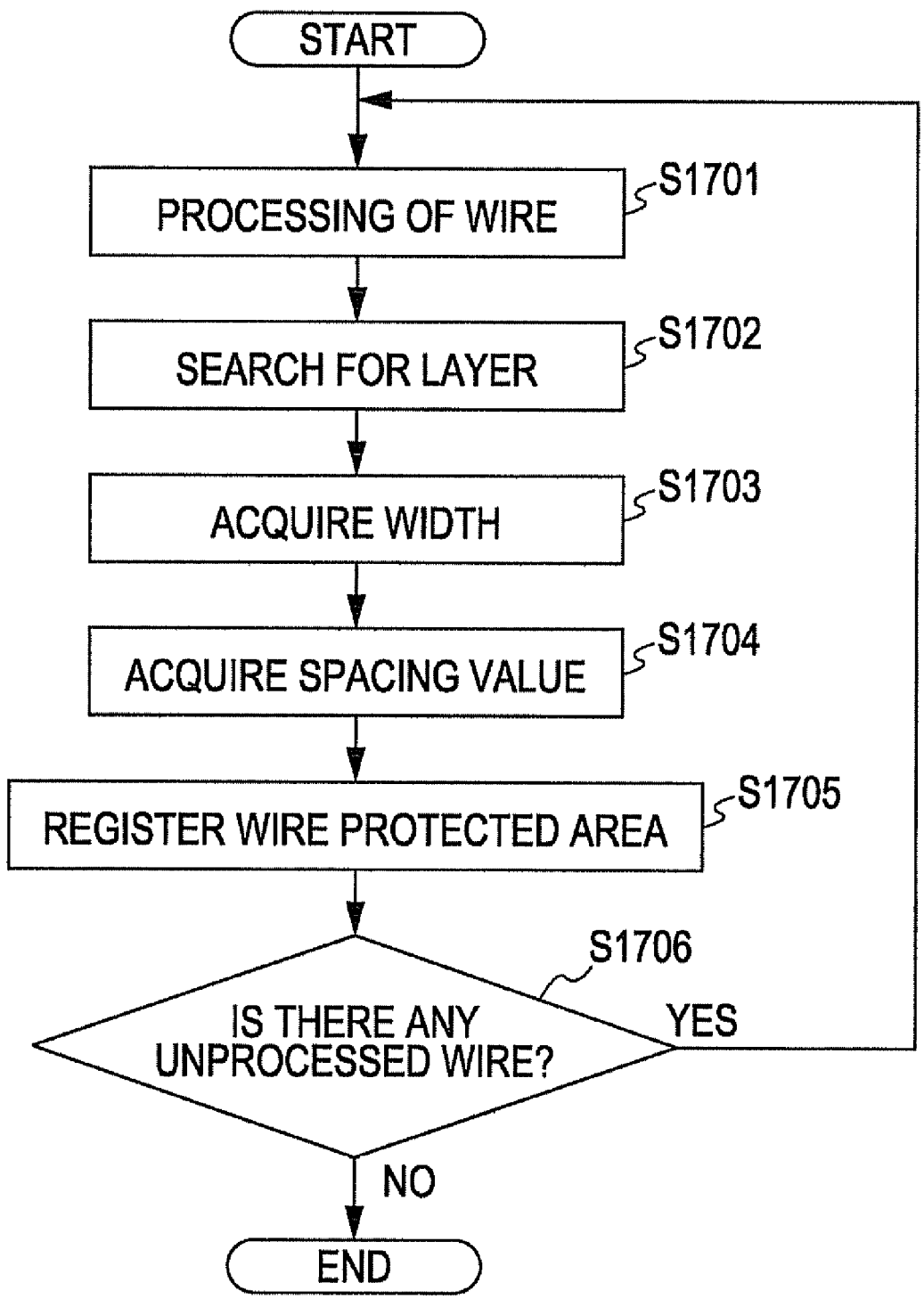
FIG. 17 is an operation flowchart illustrating the creation processing of the wire protected area for the wire at S1407 in FIG. 14.
Figure 18:
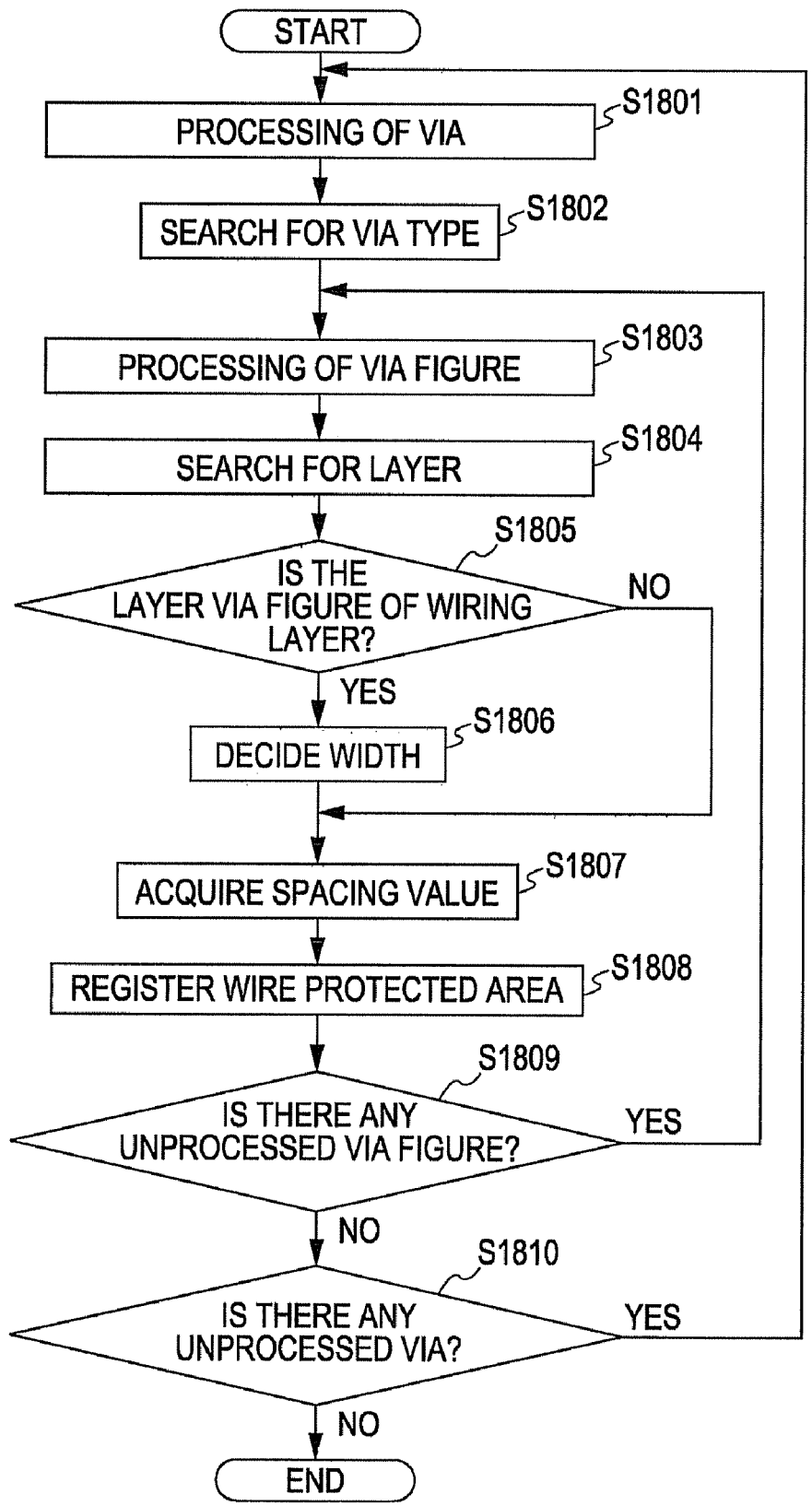
FIG. 18 is an operation flowchart illustrating the creation processing of the wire protected area for the via figure at S1408 in FIG. 14.
Figure 20:
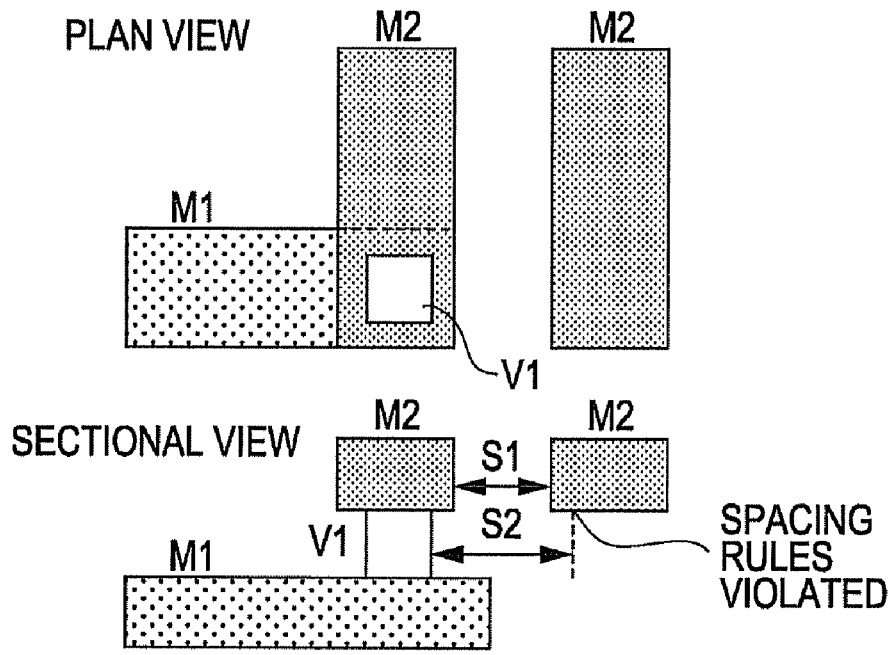
FIG. 20 is an explanatory view (part 1) of problems of conventional technology.
Figure 21:
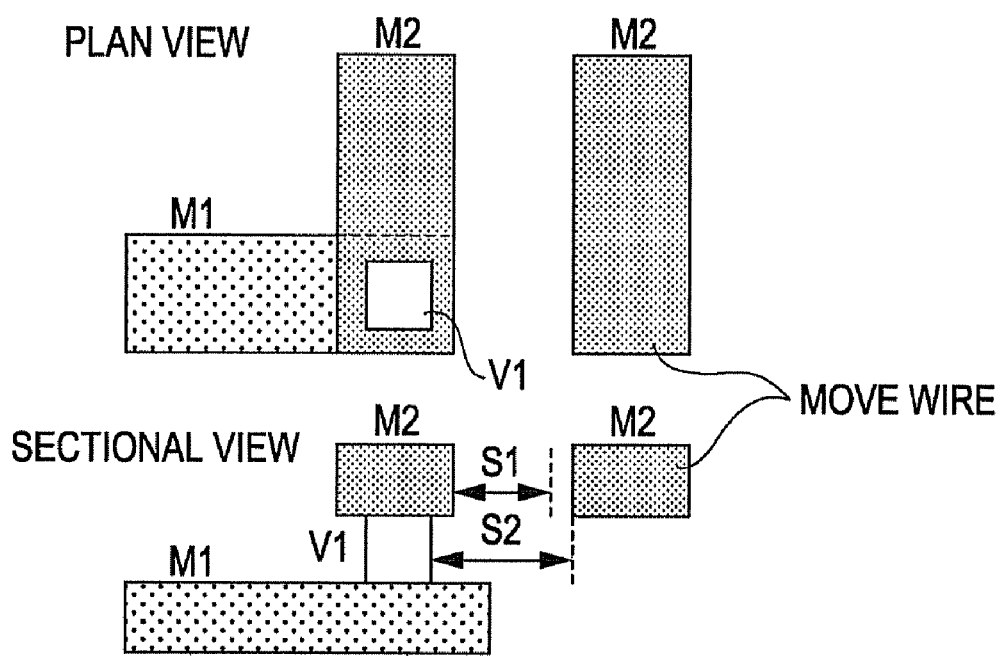
FIG. 21 is an explanatory view (part 2) of problems of conventional technology.

In control operations illustrated by the operation flowchart in FIG. 3, after standard processing (S302 in FIG. 3) of creating virtual figures described above, a control operation of wiring processing of S303 is performed. The control operation is illustrated by an operation flowchart in FIG. 9. In FIG. 9, the processes S1301 to S1303 and S1304 to S1307 are similar to the processing described for FIG. 13, in which the first the net table (see FIG. 19A) is searched by repeated processing between S1301 and the judgment at S1307 for processing all nets.

At S1302, the net type (see FIG. 19A) is verified and processing of S1303 to S1306 is performed if the net being processed has a net type to be wired.

At S1303, as creation processing (part 1) of a wire protected area by the wire protected area creation unit (part 1) 206 in FIG. 2, a wire protected area that takes spacing rules in the same layer into consideration is created for a terminal figure, obstacle figure, wire, or via figure.

In addition, at S901 subsequent to S1303, as creation processing (part 2) of a wire protected area by the wire protected area creation unit (part 2) 207 in FIG. 2, a wire protected area is created for a virtual figure created by control processing corresponding to the operation flowcharts in FIGS. 4 to 8 corresponding to S302 in FIG. 3. This processing is represented by an operation flowchart in FIG. 10 described later.

At S1304, as processing by the route searching unit 208 in FIG. 2, a pathway that connects terminal figures belonging to the net being processed is searched for by a route searching algorithm in such a way that the wire protected areas set at S1303 are avoided. At S1305, as processing by the wire registration unit 209 in FIG. 2, wires and vias are registered according to route searching results in the wire table (see FIG. 19C) and the via table (see FIG. 19D) respectively. At S1306, after wires are set to the pathway, all wire protected areas registered in the wire protected area table (see FIG. 19E) are deleted. At S1307, control returns to S1301 if there is any unprocessed net. A control operation of creation processing (part 2) of a wire protected area for the virtual figure at S901 in FIG. 9 is represented by the operation flowchart in FIG. 10.

The virtual figure table (see FIG. 11B) is searched by repeated processing between S1001 and the judgment at S1003 to perform processing of S1002 for all virtual figures. At S1002, a wire protected area is registered in the wire protected area table. The layer number of the virtual figure being processed is set as the layer number. Lower left vertex coordinates and upper right vertex coordinates of a figure obtained by extending the lower left vertex coordinates and upper right vertex coordinates of the virtual figure being processed by the spacing value held by the virtual figure vertically and horizontally are set as the lower left vertex coordinates and upper right vertex coordinates. At S1003, control returns to S1001 if there is any unprocessed virtual figure.

Here, virtual figures of processing of S402 (details are illustrated in FIG. 5), processing of S403 (details are illustrated in FIG. 6), processing of S407 (details are illustrated in FIG. 7), and processing of S408 (details are illustrated in FIG. 8) in FIG. 4 will be described. Virtual figures created by processing of the above are created corresponding to actual figures of a terminal figure, obstacle figure, wire, or via figure in a wiring layer to which wiring layer-via layer spacing rules is to be applied respectively. Then, if a wire protected area is registered by the control processing for the created virtual figure, the wire protected area is also arranged in the via layer and the area is set by taking the wiring layer-via layer spacing rules into consideration. This is because, as described above, the virtual figure is arranged in a via layer to which the wiring layer-via layer spacing rules are to be applied. Accordingly, only by performing search processing of a pathway for the via layer, generation of wiring information that takes spacing rules for the distance to the wiring layer into consideration is realized.

Conversely, if a wire protected area is registered by the control processing for the virtual figure created corresponding to an obstacle figure or via figure in a via layer to which the wiring layer-via layer spacing rules are to be applied by processing of S403 (details are illustrated in FIG. 6) or S408 (details are illustrated in FIG. 8) respectively, processing will be as follows: Since the virtual figure is arranged, as described above, in a wiring layer to which the wiring layer-via layer spacing rules are to be applied, the wire protected area is also arranged in the wiring layer and the area is set by taking the wiring layer-via layer spacing rules into consideration. Accordingly, only by performing search processing of a pathway for the wiring layer (this may be the same processing as that of conventional technology), generation of wiring information that takes spacing rules for the distance to the via layer into consideration is realized.

As described above, performing a route search so as to avoid a minimum spacing rule violation by setting a wire protected area for a virtual figure to which the minimum spacing value between wiring layer and via layer is set is equivalent to avoiding a minimum spacing rule violation between wiring layer and via layer of a distance to a wire or via that causes the virtual figure to be created. Therefore, a minimum spacing rule violation between wiring layer and via layer can be avoided by wiring information generation processing explained by control operations of the present embodiment described above.

Lastly, as an example, data registered in each table illustrated in FIGS. 11(A) to (D) and FIGS. 19(A) to (F), (H), (I), (K), and (L) for concrete examples of terminal figures, obstacle figures, wires, and via figures as illustrated in FIG. 12 will be as follows:

Table 1 is a content example of the layer table (see FIG. 19H).

TABLE 1

| # | Layer name | Layer number | Layer type | Spacing value | Spacing table | Next data |
|---|---|---|---|---|---|---|
| 1 | M1 | 1 | Wiring layer | 0 | 1 | 2 |
| 2 | V1 | 2 | Via layer | 200 | NULL | 3 |
| 3 | M2 | 3 | Wiring layer | 0 | 3 | 4 |
| 4 | V2 | 4 | Via layer | 200 | NULL | 5 |
| 5 | M3 | 5 | Wiring layer | 0 | 5 | NULL |

Table 2 is a content example of the spacing table (see FIG. 19I).

TABLE 2

| # | Minimum width | Maximum width | Spacing value | Next data |
|---|---|---|---|---|
| 1 | 0 | 1000 | 200 | 2 |
| 2 | 1001 | 3000 | 1000 | NULL |
| 3 | 0 | 1000 | 200 | 4 |
| 4 | 1001 | 10000 | 1000 | NULL |
| 5 | 0 | 1000 | 200 | 6 |
| 6 | 1001 | 10000 | 1000 | NULL |

Table 3 is a content example of the wiring layer-via layer spacing rule table (see FIG. 11A).

TABLE 3

| # | Wiring layer number | Via layer number | Spacing value | Next data |
|---|---|---|---|---|
| 1 | 1 | 2 | 300 | 2 |
| 2 | 3 | 2 | 350 | 3 |
| 3 | 3 | 4 | 300 | 4 |
| 4 | 5 | 4 | 350 | NULL |

Table 4 is a content example of the logic element device table (see FIG. 19B).

TABLE 4

| # | Logic element device name | Terminal table | Obstacle figure table | Next data |
|---|---|---|---|---|
| 1 | INST1 | 1 | 1 | NULL |

Table 5 is a content example of the terminal table (see FIG. 19F).

TABLE 5

| # | Terminal name | Terminal figure table | Next data | Net table | Next data of same net |
|---|---|---|---|---|---|
| 1 | PIN1 | 1 | 2 | 1 | NULL |
| 2 | PIN2 | 2 | NULL | 2 | NULL |

Table 6 is a content example of the terminal figure table (see FIG. 11C).

TABLE 6

| # | Layer number | Lower left vertex coordinates | Upper right vertex coordinates | Spacing flag | Next data |
|---|---|---|---|---|---|
| 1 | 3 | (500, 900) | (700, 1100) | ON | NULL |
| 2 | 3 | (1300, 900) | (1500, 1100) | OFF | NULL |

Table 7 is a content example of the obstacle figure table (see FIG. 11D).

TABLE 7

| # | Layer number | Lower left vertex coordinates | Upper right vertex coordinates | Spacing flag | Next data |
|---|---|---|---|---|---|
| 1 | 1 | (500, 500) | (700, 1100) | ON | 2 |
| 2 | 1 | (1300, 500) | (1500, 1100) | OFF | 3 |
| 3 | 2 | (500, 900) | (700, 1100) | ON | 4 |
| 4 | 2 | (1300, 900) | (1500, 1100) | OFF | NULL |

Table 8 is a content example of the net table (see FIG. 19A).

TABLE 8

| # | Net name | Net type | Wire table | Via table | Terminal table | Next data |
|---|---|---|---|---|---|---|
| 1 | NET1 | POWER | 1 | 1 | 2 | 2 |
| 2 | NET2 | SIGNAL | NULL | NULL | 1 | NULL |

Table 9 is a content example of the wire table (see FIG. 19C).

TABLE 9

| # | Layer number | Start point coordinates | End point coordinates | Wire width | Next data |
|---|---|---|---|---|---|
| 1 | 1 | (2200, 200) | (2200, 1000) | 200 | 2 |
| 2 | 3 | (2200, 1000) | (3000, 1000) | 200 | 3 |
| 3 | 5 | (3000, 1000) | (3000, 1800) | 200 | NULL |

Table 10 is a content example of the via table (see FIG. 19D).

TABLE 10

| # | Layer number | Origin coordinates | Via number | Next data |
|---|---|---|---|---|
| 1 | 2 | (2200, 1000) | 1 | 2 |
| 2 | 4 | (3000, 1000) | 2 | NULL |

Table 11 is a content example of the via type table (see FIG. 19K).

TABLE 11

| # | Via type name | Via number | Via figure table | Next data |
|---|---|---|---|---|
| 1 | VIATYPE1 | 1 | 1 | 2 |
| 2 | VIATYPE2 | 2 | 4 | NULL |

Table 12 is a content example of the via figure table (see FIG. 19L).

TABLE 12

| # | Layer number | Lower left vertex coordinates | Upper right vertex coordinates | Next data |
|---|---|---|---|---|
| 1 | 1 | (−100, −100) | (100, 100) | 2 |
| 2 | 2 | (−100, −100) | (100, 100) | 3 |
| 3 | 3 | (−100, −100) | (100, 100) | NULL |
| 4 | 3 | (−100, −100) | (100, 100) | 5 |
| 5 | 4 | (−100, −100) | (100, 100) | 6 |
| 6 | 5 | (−100, −100) | (100, 100) | NULL |

Data registered in the virtual figure table as a result of wiring information generation processing according to the present embodiment for content of each of the above tables will be as depicted below (see FIG. 11B).

TABLE 13

| # | Layer number | Lower left vertex coordinates | Upper right vertex coordinates | Spacing value | Next data |
|---|---|---|---|---|---|
| 1 | 2 | (500, 900) | (700, 1100) | 300 | 2 |
| 2 | 4 | (500, 900) | (700, 1100) | 350 | 3 |
| 3 | 2 | (500, 500) | (700, 1100) | 300 | 4 |
| 4 | 1 | (500, 900) | (700, 1100) | 300 | 5 |
| 5 | 3 | (500, 900) | (700, 1100) | 350 | 6 |
| 6 | 2 | (2100, 200) | (2300, 1000) | 300 | 7 |
| 7 | 2 | (2200, 900) | (3000, 1100) | 350 | 8 |
| 8 | 4 | (2200, 900) | (3000, 1100) | 300 | 9 |
| 9 | 4 | (2900, 1000) | (3100, 1800) | 350 | 10 |
| 10 | 2 | (2100, 900) | (2300, 1100) | 300 | 11 |
| 11 | 1 | (2100, 900) | (2300, 1100) | 300 | 12 |
| 12 | 3 | (2100, 900) | (2300, 1100) | 350 | 13 |
| 13 | 2 | (2100, 900) | (2300, 1100) | 350 | 14 |
| 14 | 4 | (2100, 900) | (2300, 1100) | 300 | 15 |
| 15 | 2 | (2900, 900) | (3100, 900) | 350 | 16 |
| 16 | 4 | (2900, 900) | (3100, 900) | 300 | 17 |

TABLE 13-continued

| # | Layer number | Lower left vertex coordinates | Upper right vertex coordinates | Spacing value | Next data |
|---|---|---|---|---|---|
| 17 | 3 | (2900, 900) | (3100, 900) | 300 | 18 |
| 18 | 5 | (2900, 900) | (3100, 900) | 350 | 19 |
| 19 | 4 | (2900, 900) | (3100, 900) | 350 | NULL |

For example, the layer number for a terminal figure of #1 in FIG. 6 is "3" and a virtual figure of #1 in Table 13 is created based on the wiring layer-via layer spacing rule of #2 in Table 3. Also, a virtual figure of #2 in Table 13 is created based on the wiring layer-via layer spacing rule of #3 in Table 3. Further, the layer number for an obstacle figure of #3 in FIG. 7 is "2" and a virtual figure of #4 in Table 13 is created based on the wiring layer-via layer spacing rule of #1 in Table 3. Then, a virtual figure of #5 in Table 13 is created based on the wiring layer-via layer spacing rule of #2 in Table 3.

According to an aspect of the embodiments of the invention, any combinations of one or more of the described features, functions, operations, and/or benefits can be provided. The embodiments can be implemented as an apparatus (a machine) that includes computing hardware (i.e., computing apparatus), such as (in a non-limiting example) any computer that can store, retrieve, process and/or output data and/or communicate (network) with other computers. According to an aspect of an embodiment, the described features, functions, operations, and/or benefits can be implemented by and/or use computing hardware and/or software. The apparatus (e.g., the computer system in FIG. 1 can comprise a controller (CPU) 101 (e.g., a hardware logic circuitry based computer processor that processes or executes instructions, namely software/program), computer readable recording media, for example, memory 102 and hard disk drive 103, transmission communication media interface (network interface), and/or a display device 150, all in communication through a data communication bus 106. In addition, an apparatus can include one or more apparatuses in computer network communication with each other or other apparatuses. In addition, a computer processor can include one or more computer processors in one or more apparatuses or any combinations of one or more computer processors and/or apparatuses. An aspect of an embodiment relates to causing one or more apparatuses and/or computer processors to execute the described operations. The results produced can be displayed on the display.

A program/software implementing the embodiments may be recorded on computer-readable recording media. Examples of the computer-readable recording media include a magnetic recording apparatus, an optical disk, a magneto-optical disk, and/or volatile and/or non-volatile semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), DVD-ROM, DVD-RAM (DVD-Random Access Memory), BD (Blue-ray Disk), a CD-ROM (Compact Disc-Read Only Memory), and a CD-R (Recordable)/RW.

The program/software implementing the embodiments may also be included/encoded as a data signal and transmitted over transmission communication media. A data signal moves on transmission communication media, such as wired network or wireless network, for example, by being incorporated in a carrier wave. The data signal may also be transferred by a so-called baseband signal. A carrier wave can be transmitted in an electrical, magnetic or electromagnetic form, or an optical, acoustic or any other form.]

All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A wiring information generating apparatus that connects a plurality of logic element devices arranged on a substrate of a semiconductor logic circuit, the wiring information generating apparatus comprising:
an input unit that inputs a wiring layer number indicating a wiring layer in which wiring is to be carried out, a via layer number indicating a next via layer to connect the wiring layer with other wiring layer, and spacing information based on wiring rules;
a storage unit that stores a terminal figure table providing a terminal figure of a logic element device, a logic element device wire protected area table providing logic element device wire protected areas inside the logic element device, and a wire protected area table providing wire protected area information for the semiconductor logic circuit;
a wire protected area creation unit that creates wire protected area information for the semiconductor logic circuit by
adding to the wire protected area table an area of a terminal figure and a logic element device wire protected area that are obtained by searching the terminal figure table and the logic element device wire protected area table based on the input wiring layer number and/or via layer number,
acquiring first wire layer-via layer spacing information indicating spacing between one of a plurality of wiring layers and one of a plurality of via layers based on the wiring layer number and/or via layer number, and
adding the first wire layer-via layer spacing information to the wire protected area table; and
a wiring information generating unit that generates wiring information in a wiring layer based on connection information and arrangement information of the semiconductor logic circuit, and the wire protected area information.

2. The wiring information generating apparatus according to claim 1, wherein the wire protected area creation unit adds the first wire layer-via layer spacing information by:
creating a virtual figure based on an area of the terminal figure and a logic element device wire protected area, obtained by the searching of the terminal figure table and the logic element device wire protected area table, and
adding the area of the terminal figure and the logic element device wire protected area to the wire protected area table by creating a new wire protected area based on the created virtual figure.

3. The wiring information generating apparatus according to claim 1, further comprising:
a virtual figure creation unit that acquires second spacing information indicating spacing between one wire and another wire and adds the acquired second spacing information to the wire protected area table based on predetermined conditions.

4. The wiring information generating apparatus according to claim 3, wherein the first wire layer-via layer spacing information represents a horizontal distance between one via layer among the plurality of via layers and the one wire when the semiconductor substrate is assumed to be in a horizontal plane, and the second spacing information represents a horizontal distance between the one wire and another wire when the semiconductor substrate is assumed to be in the horizontal plane.

5. The wiring information generating apparatus according to claim 1, wherein the wire protected area creation unit adds the first wire layer-via layer spacing information to the wire protected area table by setting a wire protected area, based on the first wire layer-via layer spacing information and the area of the terminal figure and/or the logic element device wire protected area arranged in one wiring layer-via layer pair for which the first wire layer-via layer spacing information is set, to another pair and adding the first wire layer-via layer spacing information as the wire protected area information to the wire protected area table.

6. The wiring information generating apparatus according to claim 1, wherein the storage unit further stores a wire table providing existing wires and a via figure table providing existing via figures, and
the wire protected area creation unit further adds to the wire protected area table an area of a wire and/or an area of a via figure obtained by searching the wire table and the via figure table based on the input wiring layer number and/or via layer number.

7. A wiring information generating method that connects a plurality of logic element devices arranged on a substrate of a semiconductor logic circuit, the wiring information generation method comprising:
inputting a wiring layer number indicating a wiring layer in which wiring is to be carried out, a via layer number indicating a next via layer to connect the wiring layer with other wiring layer, and spacing information based on wiring rules;
storing a terminal figure table providing a terminal figure of a logic element device, a logic element device wire protected area table providing logic element device wire protected areas inside the logic element device, and a wire protected area table providing wire protected area information for the semiconductor logic circuit;
searching the terminal figure table and the logic element device wire protected area table based on the input wiring layer number and/or via layer number;
adding to the wire protected area table an area of a terminal figure and a logic element device wire protected area, obtained by searching of the terminal figure table and the logic element device wire protected area table;
acquiring first wire layer-via layer spacing information representing spacing between one of a plurality of wiring layers and one of a plurality of via layers based on the wiring layer number and/or via layer number;
adding the first wire layer-via layer spacing information to the wire protected area table; and
generating wiring information in a wiring layer among the plurality of wiring layers based on connection information and arrangement information of the semiconductor logic circuit, and the wire protected area information.

8. The wiring information generating method according to claim 7, wherein the adding of the first wire layer-via layer spacing information to the wire protected area table includes:

generating a virtual figure based on an area of the terminal figure and a logic element device wire protected area, obtained by the searching of the terminal figure table and the logic element device wire protected area table, and adding the area of the terminal figure and the logic element device wire protected area to the wire protected area table by generating a new wire protected area based on the generated virtual figure.

9. The wiring information generating method according to claim 7, further comprising:

acquiring second spacing information representing spacing between one wire and another wire; and adding the acquired second spacing information to the wire protected area table based on predetermined conditions.

10. The wiring information generating method according to claim 7, wherein the adding of the first wire layer-via layer spacing information to the wire protected area table further includes:

setting a wire protected area, based on the first wire layer-via layer spacing information and the area of the terminal figure and/or the logic element device wire protected area arranged in one wiring layer-via layer pair for which the first wire layer-via layer spacing information is set, to another pair and adding the first wire layer-via layer spacing information as the wire protected area information to the wire protected area table.

11. A non-transitory computer readable recording medium that stores a wiring information generating program that causes a computer to execute:

inputting a wiring layer number indicating a wiring layer in which wiring is to be carried out, a via layer number indicating a next via layer to connect the wiring layer with other wiring layer, and spacing information based on wiring rules;

storing a terminal figure table providing a terminal figure of a logic element device, a logic element device wire protected area table providing logic element device wire protected areas inside the logic element device, and a wire protected area table providing wire protected area information for the semiconductor logic circuit;

searching the terminal figure table and the logic element device wire protected area table based on the input wiring layer number and/or via layer number to the wire protected area table;

adding to the wire protected area table an area of a terminal figure and a logic element device wire protected area, obtained by searching of the terminal figure table and the logic element device wire protected area table;

acquiring first wire layer-via layer spacing information that is spacing between one of a plurality of wiring layers and one of a plurality of via layers based on the wiring layer number and/or via layer number;

adding the first wire layer-via layer spacing information to the wire protected area table; and generating wiring information in a wiring layer based on connection information and arrangement information of the semiconductor logic circuit, and the wire protected area information.

12. The non-transitory computer readable recording medium according to claim 11, wherein the adding of the first wire layer-via layer spacing information to the wire protected area table includes:

creating a virtual figure based on an area of the terminal figure and a logic element device wire protected area, obtained by the searching of the terminal figure table and the logic element device wire protected area table, and adding the area of the terminal figure and the logic element device wire protected area to the wire protected area table by creating a new wire protected area based on the created virtual figure.

13. The non-transitory computer readable recording medium according to claim 11, the wring information generating program further causing the computer to executing:

acquiring second spacing information that is spacing between one wire and another wire; and adding the acquired second spacing information to the wire protected area table based on predetermined conditions.

14. The non-transitory computer readable recording medium according to claim 11, wherein the adding of first wire layer-via layer spacing information to the wire protected area table includes:

setting a wire protected area, based on the first wire layer-via layer spacing information and the area of the terminal figure and/or the logic element device wire protected area arranged in one wiring layer-via layer pair for which the first wire layer-via layer spacing information is set, to another pair and adding the first wire layer-via layer spacing information as the wire protected area information to the wire protected area table.

* * * * *